(12) United States Patent
Uesaka et al.

(10) Patent No.: US 11,218,176 B2
(45) Date of Patent: Jan. 4, 2022

(54) FIRST COMMUNICATION DEVICE, SECOND COMMUNICATION DEVICE, AND METHODS PERFORMED THEREBY FOR HANDLING DECODING OF A CHANNEL

(71) Applicant: Telefonaktiebolaget LM Ericsson (publ), Stockholm (SE)

(72) Inventors: Kazuyoshi Uesaka, Kawasaki (JP); Muhammad Kazmi, Sundbyberg (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/764,531

(22) PCT Filed: Nov. 14, 2018

(86) PCT No.: PCT/SE2018/051168
§ 371 (c)(1),
(2) Date: May 15, 2020

(87) PCT Pub. No.: WO2019/098919
PCT Pub. Date: May 23, 2019

(65) Prior Publication Data
US 2020/0336158 A1   Oct. 22, 2020

Related U.S. Application Data

(60) Provisional application No. 62/587,662, filed on Nov. 17, 2017.

(51) Int. Cl.
*H03M 13/00* (2006.01)
*H03M 13/37* (2006.01)
(Continued)

(52) U.S. Cl.
CPC ....... *H03M 13/3769* (2013.01); *H03M 13/13* (2013.01); *H04L 1/0045* (2013.01); *H04W 72/0446* (2013.01)

(58) Field of Classification Search
None
See application file for complete search history.

(56) References Cited

U.S. PATENT DOCUMENTS

| 2007/0206531 | A1* | 9/2007 | Pajukoski | H04W 74/0866 |
| | | | | 370/329 |
| 2016/0037550 | A1* | 2/2016 | Barabell | H04W 72/046 |
| | | | | 455/450 |

(Continued)

FOREIGN PATENT DOCUMENTS

WO   2016173922 A1   11/2016

OTHER PUBLICATIONS

Huawei, et al., "R1-1708166: Discussion on SS block time index indication," Third Generation Partnership Project (3GPP), TSG RAN WG1 Meeting #89, May 15-19, 2017, 5 pages, Hangzhou, China.

(Continued)

*Primary Examiner* — Mujtaba M Chaudry
(74) *Attorney, Agent, or Firm* — Christopher & Weisberg, P.A.

(57) ABSTRACT

A method performed by a first communication device is disclosed herein. The first communication device operates in a communications network. The first communication device selects a first method to decode a physical broadcast channel from a plurality of methods to decode the physical broadcast channel. The plurality of methods to decode the physical broadcast channel comprises: a) single-shot decoding only, b) soft-combining decoding only, and c) both single-shot decoding and soft-combining decoding simultaneously. The selecting is based on whether or not a time index of a synchronization signal and physical broadcast channel block, SS/PBCH block, for transmitting primary and secondary synchronization signals and a physical broadcast channel is known by the first communication device. The (Continued)

first communication device then decodes the received physical broadcast channel based on the selected first method.

6 Claims, 14 Drawing Sheets

(51) Int. Cl.
*H03M 13/13* (2006.01)
*H04L 1/00* (2006.01)
*H04W 72/04* (2009.01)

(56) References Cited

U.S. PATENT DOCUMENTS

2017/0366311 A1* 12/2017 Iyer .................. H04B 7/0482
2018/0083688 A1* 3/2018 Agiwal .............. H04W 12/033
2018/0176945 A1* 6/2018 Cao .................. H04W 72/1268

OTHER PUBLICATIONS

NTT Docomo, Inc. "R4-1709443: Discussion on other link level simulation assumptions," Third Generation Partnership Project (3GPP), TSG RAN WG4 Meeting NR ad-hoc #3, Sep. 18-21, 2017, 5 pages, Nagoya, Japan.

Qualcomm Incorporated, "R1-1711646: Timing indication based on SS block consideration," Third Generation Partnership Project (3GPP), TSG-RAN WG1 Ad-Hoc#2, Jun. 27-30, 2017, 14 pages, Qingdao, P.R. China.

International Search Report and Written Opinion for International Patent Application No. PCT/SE2018/051168, dated Mar. 18, 2019, 12 pages.

EPO Communication and European Search Report dated Jul. 7, 2021 for Patent Application No. 18879830.0, consisting of 7-pages.

3GPP TSG-RAN WG1 Meeting #89 R1-1708233; Title: SS block time index indication; Agenda Item: 7.1.1.1.3; Source: Nokia, Alcatel-Lucent Shanghai Bell; Document for: Discussion and Decision; Date and Location: May 15-19, 2017, Hangzhou, China, consisting of 9-pages.

3GPP TSG RAN WG1 Meeting #90bis R1-1718373; Title: Polar code for PBCH and soft combining; Agenda Item: 7.4.3; Source: Huawei, HiSilicon; Document for: Discussion and Decision; Date and Location: Oct. 9-13, 2017, Prague, Czech Republic, consisting of 13-pages.

* cited by examiner a)

b)

a)

b)

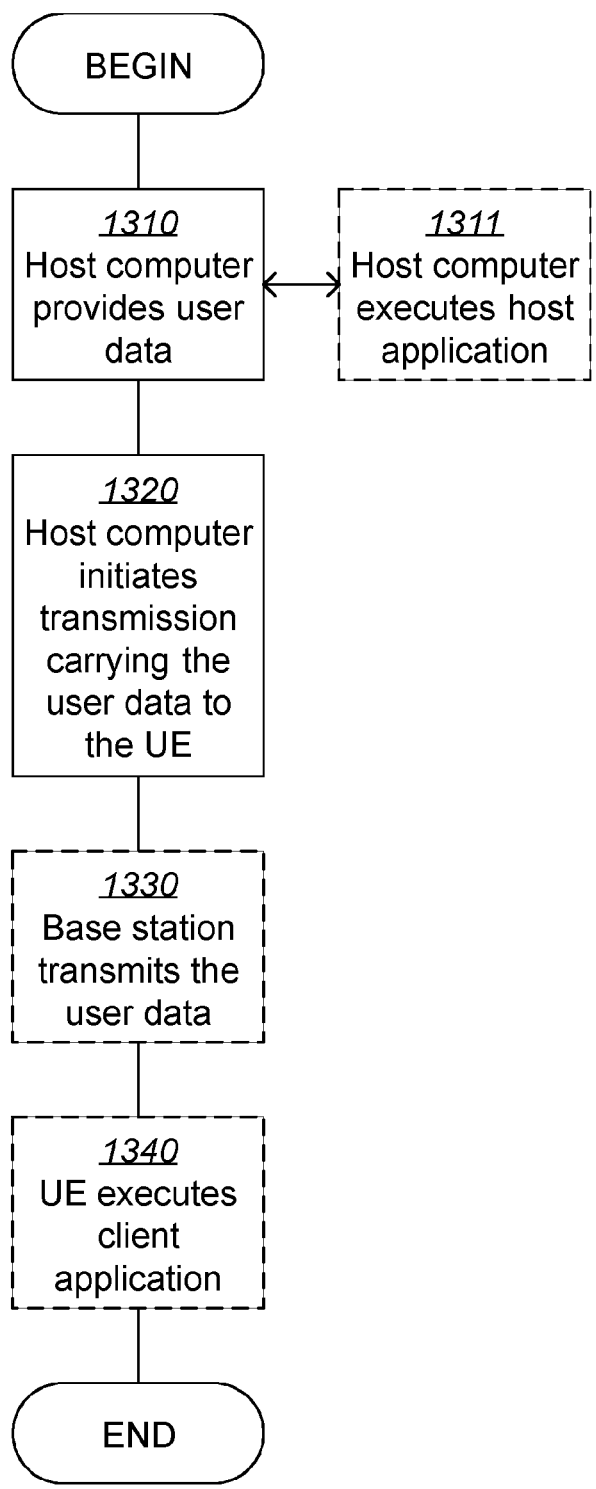
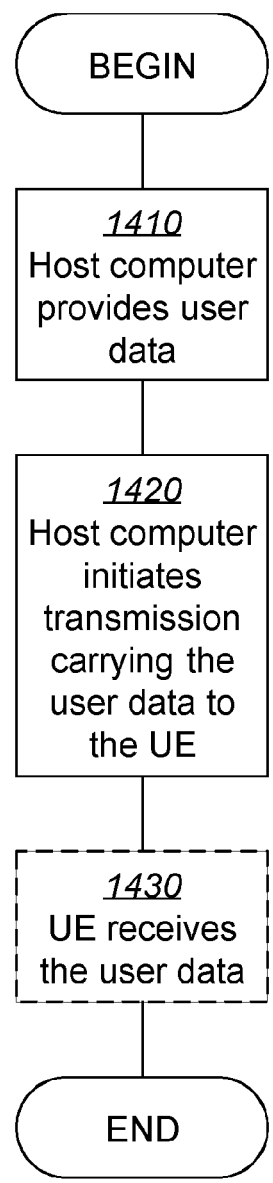
FIG. 13
FIG. 14

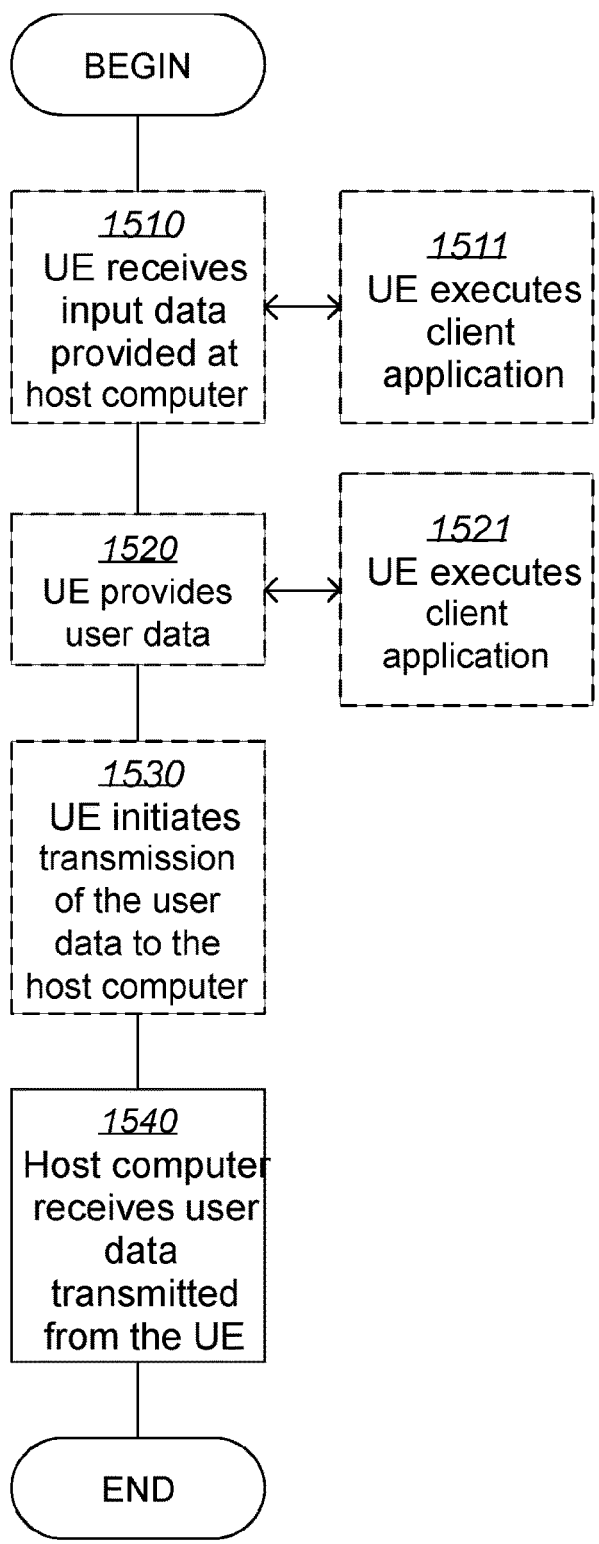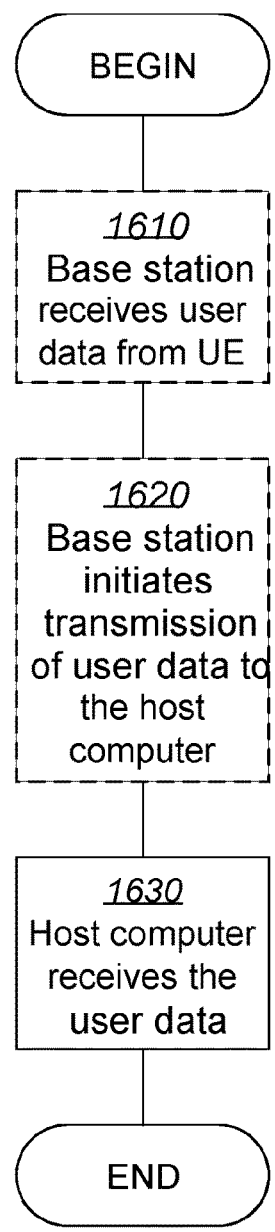
FIG. 15
FIG. 16

FIRST COMMUNICATION DEVICE, SECOND COMMUNICATION DEVICE, AND METHODS PERFORMED THEREBY FOR HANDLING DECODING OF A CHANNEL

This application is a 35 U.S.C. § 371 national phase filing of International Application No. PCT/SE2018/051168, filed Nov. 14, 2018, which claims the benefit of U.S. Provisional Application No. 62/587,662, filed Nov. 17, 2017, the disclosures of which are incorporated herein by reference in their entireties.

TECHNICAL FIELD

The present disclosure relates generally to a first communication device and methods performed thereby for handling decoding of a channel. The present disclosure also relates generally to a second communication device and methods performed thereby for handling decoding of the channel.

BACKGROUND

Communication devices within a wireless communications network may be wireless devices such as e.g., User Equipments (UEs), stations (STAs), mobile terminals, wireless terminals, terminals, and/or Mobile Stations (MS). Wireless devices are enabled to communicate wirelessly in a cellular communications network or wireless communication network, sometimes also referred to as a cellular radio system, cellular system, or cellular network. The communication may be performed e.g. between two wireless devices, between a wireless device and a regular telephone, and/or between a wireless device and a server via a Radio Access Network (RAN), and possibly one or more core networks, comprised within the wireless communications network. Wireless devices may further be referred to as mobile telephones, cellular telephones, laptops, or tablets with wireless capability, just to mention some further examples. The wireless devices in the present context may be, for example, portable, pocket-storable, hand-held, computer-comprised, or vehicle-mounted mobile devices, enabled to communicate voice and/or data, via the RAN, with another entity, such as another terminal or a server.

Communication devices may also be network nodes, such as radio network nodes, e.g., Transmission Points (TP). The wireless communications network covers a geographical area which may be divided into cell areas, each cell area being served by a network node such as a Base Station (BS), e.g., a Radio Base Station (RBS), which sometimes may be referred to as e.g., gNB, evolved Node B ("eNB"), "eNodeB", "NodeB", "B node", or BTS (Base Transceiver Station), depending on the technology and terminology used. The base stations may be of different classes such as e.g., Wide Area Base Stations, Medium Range Base Stations, Local Area Base Stations and Home Base Stations, based on transmission power and thereby also cell size. A cell is the geographical area where radio coverage is provided by the base station at a base station site. One base station, situated on the base station site, may serve one or several cells. Further, each base station may support one or several communication technologies. The wireless communications network may also be a non-cellular system, comprising network nodes which may serve receiving nodes, such as wireless devices, with serving beams. In 3rd Generation Partnership Project (3GPP) Long Term Evolution (LTE), base stations, which may be referred to as eNodeBs or even eNBs, may be directly connected to one or more core networks. In the context of this disclosure, the expression Downlink (DL) may be used for the transmission path from the base station to the wireless device. The expression Uplink (UL) may be used for the transmission path in the opposite direction i.e., from the wireless device to the base station.

New Radio (NR) Cell Acquisition Procedure

When an NR User Equipment (UE) turns on the power or start neighboring cell search, the UE may first search synchronization signals. The synchronization signals may consist of Primary synchronizations signals (PSS) and secondary synchronization signals (SSS). After PSS/SSS acquisition, the UE may know the cell Identifier (ID), and may synchronize with the network with regards to frame timing. After that, the UE may try to receive the Physical broadcast channel (PBCH) to decode the master information block for NR (NR-MIB), which may contain the minimum information to access to the network.

In NR, all the signals may be transmitted on one or more beams within one cell. Consider the network has two beams, e.g., beam A and beam B. Since usually different beams are transmitted on different directions, that is, the covered area of beam A and beam B is not overlapped, if the synchronization symbols and PBCH are transmitted only on the beam A, the UE located in the beam B area may not be able to acquire the synchronization channel. In NR, each beam may have its own PSS/SSS/PBCH transmission, and it may be called a Synchronization Signal Physical broadcast channel (SS/PBCH) block. One SS/PBCH block may be transmitted using 240 consecutive sub-carriers with 4 Orthogonal Frequency Division Multiplexing (OFDM) symbols.

One network node may transmit different SS/PBCH blocks with different timing within a 5 ms window. This 5 ms may be called SS burst, and one SS burst may contain all the SS/PBCH blocks the network node may transmit. The SS burst transmit periodicity may depend on the network and may be configurable, for example, 5 ms, 10 ms, 20 ms, 40 ms, 80 ms, and 160 ms. The maximum number of SS/BPCH blocks in one SS burst may depend on the carrier frequency. For a carrier frequency below 3 GHz, the maximum number of SS/PBCH blocks may be 4. For carrier frequency above 3 GHz and below 6 GHz, the maximum number of SS/PBCH blocks may be 8. For carrier frequency above 6 GHz, the maximum number of SS/PBCH blocks may be 64.

When a UE acquires a synchronization signal in one of the SS/PBCH blocks in the SS burst, the UE may estimate the transmission timing within the SS burst, that is, the SS/PBCH block timing index, and it may report the acquired timing index to the network node. The network node may then know which beam the UE is receiving based on the SS/PBCH block timing index reported by the UE.

The method of timing index estimation may depend on the carrier frequency. For the center frequency below 6 GHz, the timing index may be estimated from the demodulation reference signal (DMRS) used for PBCH (PBCH-DMRS). PBCH-DMRS may be transmitted inside an SS/PBCH block and they may be used to demodulate PBCH symbols. The network node may set the different DMRS sequences according to the SS/PBCH time index. The time index may be understood to indicate a location of a beam in time within the SS burst. The DMRS sequence may use the Gold-sequence and its initial value may be set based on the SS/PBCH timing index. Since the center frequency below 6 GHz may configure 8 SS/PBCH blocks, there may be 8 possible DMRS sequences. When the UE acquires PSS/SSS in one SS burst, the UE may decide the most probable time index from the DMRS in the SS burst, and it may report to the network node.

For the center frequency above 6 GHz, because it may transmit 64 SS/PBCH blocks in one SS burst, PBCH-DMRS is not sufficient to know the timing index. For above 6 GHz, the timing index may be given by 6 bits ($2^6=64$), but the UE may know only 3 least significant bits (LSBs) from the PBCH-DMRS. The rest of the information, 3 most significant bits (MSBs), may be included in the NB-MIB transmitted on PBCH.

FIG. 1 depicts an example of an SS/PBCH block structure and transmission of two SS/PBCH blocks within one SS burst. As depicted in the Figure, an SS/PBCH block comprises DMRS for PBCH, PBCH, PSS and SSS symbols, spread across 240 subcarriers (sc). As shown in FIG. 1, 144 symbols of DMRS are transmitted inside an SS/PBCH block. As indicated by the dashed line leading to the top right panel, within a 5 ms time window, wherein an SS burst set is transmitted, a first SS/PBCH block, SS/PBCH block 1, is transmitted with time index k1, and a second SS/PBCH block, SS/PBCH 2, is transmitted with time index k2. In the example depicted in FIG. 1, this is repeated every 20 ms, when the SS burst set is transmitted once within every SS burst set period, once in SFN N, once in SNF N+2, and so forth.

NR-MIB

The master information block for NR (NB-MIB) may be understood as the minimum information block a UE may acquire the first time when it may connect to the NR network. An example of MIB information may be the timing information MIB is transmitted. For example, MIB information may be: the system frame number (SFN), a part of the SS/PBCH block start position where MIB is transmitted within the SS burst (remaining SSB block index), SSB block is transmitted in the first half of radio frame or second half of radio frame (half-frame timing), and/or information of more system information scheduling.

The MIB transmit time interval (TTI) may be 80 ms. This may be understood to mean the NR-MIB information may change every 80 ms, except for SFN. Since the SFN may change every 10 ms, the information bits corresponding to SFN may change depending on the transmitted SFN.

NR PBCH

PBCH may be understood as the physical channel that may transmit the NR-MIB information. FIG. 2 depicts an example of Broadcast Channel (BCH) transport channel processing and mapping to the physical broadcast channel.

An NR-MIB may comprise, for example, 10 bits with SFN, 1 bit with half radio frame, 3 MSBs of time index for mmW, etc. . . . First, a 1st scrambling may be performed on the NR-MIB information bits with the 1st scrambling code, where scrambling may be understood as the exclusive OR (XOR) operation between the NR-MIB information bits and the 1st scrambling code bits. For the 1st scrambling, the information bits corresponding to the SS block time index, half radio frame, and 2nd/3rd LSBs of SFN may be excluded from the scrambling. The first scrambling may be understood to be based on the Cell ID, and on the $2^{nd}$ and $3^{rd}$ LSBs of SFN N. The information of 2nd and 3rd LSBs of the SFN may change every 20 ms.

After the first scrambling, the cyclic redundancy check (CRC) bits, 24 bits in the Figure, may be calculated from the 1st scrambled NR-MIB information bits, and added. The information size after CRC attachment may be 56 bits. After that, channel coding is performed on the information bits with a Polar coder, and rate matching is performed after that to fit the bits to the PBCH symbols. Nmax, which may be understood to be the number of information bits after channel coding, may be 512 bits. M, which may be understood to be the number of information bits after rate matching, may be 864 bits. The rate matched information bits may be modulated with Quadrature phase shift keying (QPSK) modulation, which may result in a total number of PBCH symbols after QPSK modulation (L) of 432 symbols, and a 2nd scrambling may be performed on them. The 2nd scrambling sequence may be generated based on the cell ID and the 3 LSBs of SS/PBCH block time index K, which may result in 432 symbols, which may then, be mapped to the resource elements (REs) for PBCH. As depicted in the example of FIG. 2, the 432 PBCH symbols may be mapped to the 4 different SS burst sets that are comprised within a PBCH TTI, in the SFN, the SFN+2, SFN+4 and SFN-6.

PBCH Decoding

A UE may try two methods for decoding PBCH; one known as single shot based decoding and another known as soft-combining, as described next.

Single Shot Decoding

In the single shot decoding method, the UE may try the PBCH decoding every SS burst set periodicity, e.g., 20 ms, until the UE may be able to acquire NR-MIB, which may be judged with the CRC that may be attached to the MIB.

FIG. 3 depicts a block diagram of an example of a PBCH single-shot receiver. As depicted in FIG. 3, a SS burst set is transmitted once within every SS burst set period, and this is repeated every 20 ms. This means an SS burst set is transmitted, once in SFN N and once in SNF N+2, within a 40 ms time window. According to the single shot method, the PBCH from a single SS bust set is first de-scrambled, resulting in 432 symbols. After the UE receives one PBCH, the UE may perform the 2nd de-scrambling with the 2nd scrambling code generated from the 3 LSBs of time index which may be estimated from PBCH-DMRS sequence. After then, the UE may equalize the received PBCH symbols from the DMRS and generate the soft-bits, here 864 soft-bits, with de-mapping. The soft-bits are then decoded with a polar decoder. This chain of actions is then repeated, independently, for the next SS burst transmitted in SFN+2.

Soft-Combing

Soft combining may be understood as a method whereby a UE may combine two or more PBCH soft-bits before rate de-matching and/or Polar decoding. FIG. 4 depicts a block diagram of an example of a PBCH soft-combining receiver. In the depicted example, two SS burst sets are transmitted as described in FIG. 3. After the UE receives one PBCH, the UE may perform the 2nd de-scrambling with the 2nd scrambling code generated from the 3 LSBs of time index which may be estimated from PBCH-DMRS sequence. After then, the UE may equalize the received PBCH symbols from the DMRS and generate the soft-bits with de-mapping. Then, the UE may combine the PBCH soft-bits received in different SS burst after performing a post processing to compensate the signs of soft-bits that may come from the different 2nd/3rd LSBs of SFN. The resulting symbols may be stored in a symbol buffer and rate matched again, according to a polar decoder.

In the case of 20 ms periodicity, the 2 PBCH soft-combining receiver may combine two consecutive PBCH soft-bits and decoding, until the UE may acquire NR-MIB, which may be judged with CRC attached to MIB. Since the UE may receive PBCH every 20 ms, the decoding attempts may be every 20 ms.

Acquisition of broadcast information according to existing methods may result in wastage of processing and energy resources.

SUMMARY

It is an object of embodiments herein to improve decoding methods in a communications network. It is a particular object of embodiments herein to improve the decoding of broadcasting information in a communications network.

According to a first aspect of embodiments herein, the object is achieved by a method performed by a first communication device. The first communication device operates in a communications network. The first communication device selects a first method to decode a physical broadcast channel from a plurality of methods to decode the physical broadcast channel. The plurality of methods to decode the physical broadcast channel comprises: a) single-shot decoding only, b) soft-combining decoding only, and c) both single-shot decoding and soft-combining decoding simultaneously. The selecting is based on whether or not a time index of a synchronization signal and physical broadcast channel block (SS/PBCH block) for transmitting primary and secondary synchronization signals and a physical broadcast channel is known by the first communication device. The first communication device decodes the received physical broadcast channel based on the selected first method.

According to a second aspect of embodiments herein, the object is achieved by a method performed by the second communication device. The second communication device operates in the communications network. The second communication device obtains the set of correspondences between the first set of physical cell identity information of the second communication device and the second set of time indexes of synchronization signal and physical broadcast channel (SS/PBCH) blocks configured in the secondary communication device. The second communication device determines the time index of the synchronization signal and PBCH block (SS/PBCH block) for transmitting primary and secondary synchronization signals and the physical broadcast channel to the first communication device operating in the communications network. The second communication device also initiates providing the first indication of the determined time index of the SS/PBCH block to the first communication device. The first indication provided to the first communication device is based on the generated set of correspondences.

According to a third aspect of embodiments herein, the object is achieved by the first communication device, configured to operate in the communications network. The first communication device is further configured to select the method to decode the physical broadcast channel from the plurality of methods to decode the physical broadcast channel. The plurality of methods to decode the physical broadcast channel is configured to comprise: a) single-shot decoding only, b) soft-combining decoding only, and c) both single-shot decoding and soft-combining decoding simultaneously. To select is configured to be based on whether or not the time index of the synchronization signal and physical broadcast channel block (SS/PBCH block), for transmitting primary and secondary synchronization signals and the physical broadcast channel is known by the first communication device. The first communication device is also configured to decode the physical broadcast channel configured to be received based on the method configured to be selected.

According to a fourth aspect of embodiments herein, the object is achieved by the second communication device, configured to operate in the communications network. The second communication device is configured to obtain the set of correspondences between the first set of physical cell identity information of the second communication device and the second set of time indexes of synchronization signal and physical broadcast channel (SS/PBCH) blocks configured in the secondary communication device. The second communication device is also configured to determine the time index of the synchronization signal and PBCH block (SS/PBCH block) for transmitting primary and secondary synchronization signals and the physical broadcast channel to the first communication device configured to operate in the communications network. The second communication device is further configured to initiate providing the first indication of the time index of the SS/PBCH block configured to be determined to the first communication device. The first indication configured to be provided to the first communication device is configured to be based on the set of correspondences configured to be generated.

By the first communication device selecting the method to decode the (physical) broadcast channel based on the one or more properties of the radio channel, the first communication device adaptively selects the method, avoiding performing all possible decoding methods. Therefore, the broadcasted information may be acquired more quickly, and with power efficiency. Consequently, processing and energy resources in the communications network may be used more efficiently.

By determining the time index and initiating providing the time index to the first communication device, the second communication device may assist the first communication device to perform the selection of the method, that is, the first method.

BRIEF DESCRIPTION OF THE DRAWINGS

Examples of embodiments herein are described in more detail with reference to the accompanying drawings, and according to the following description.

FIG. 13 is a flowchart depicting embodiments of a method in a communications system including a host computer, a base station and a user equipment, according to embodiments herein.

FIG. 14 is a flowchart depicting embodiments of a method in a communications system including a host computer, a base station and a user equipment, according to embodiments herein.

FIG. 15 is a flowchart depicting embodiments of a method in a communications system including a host computer, a base station and a user equipment, according to embodiments herein.

FIG. 16 is a flowchart depicting embodiments of a method in a communications system including a host computer, a base station and a user equipment, according to embodiments herein.

DETAILED DESCRIPTION

Figure 1:
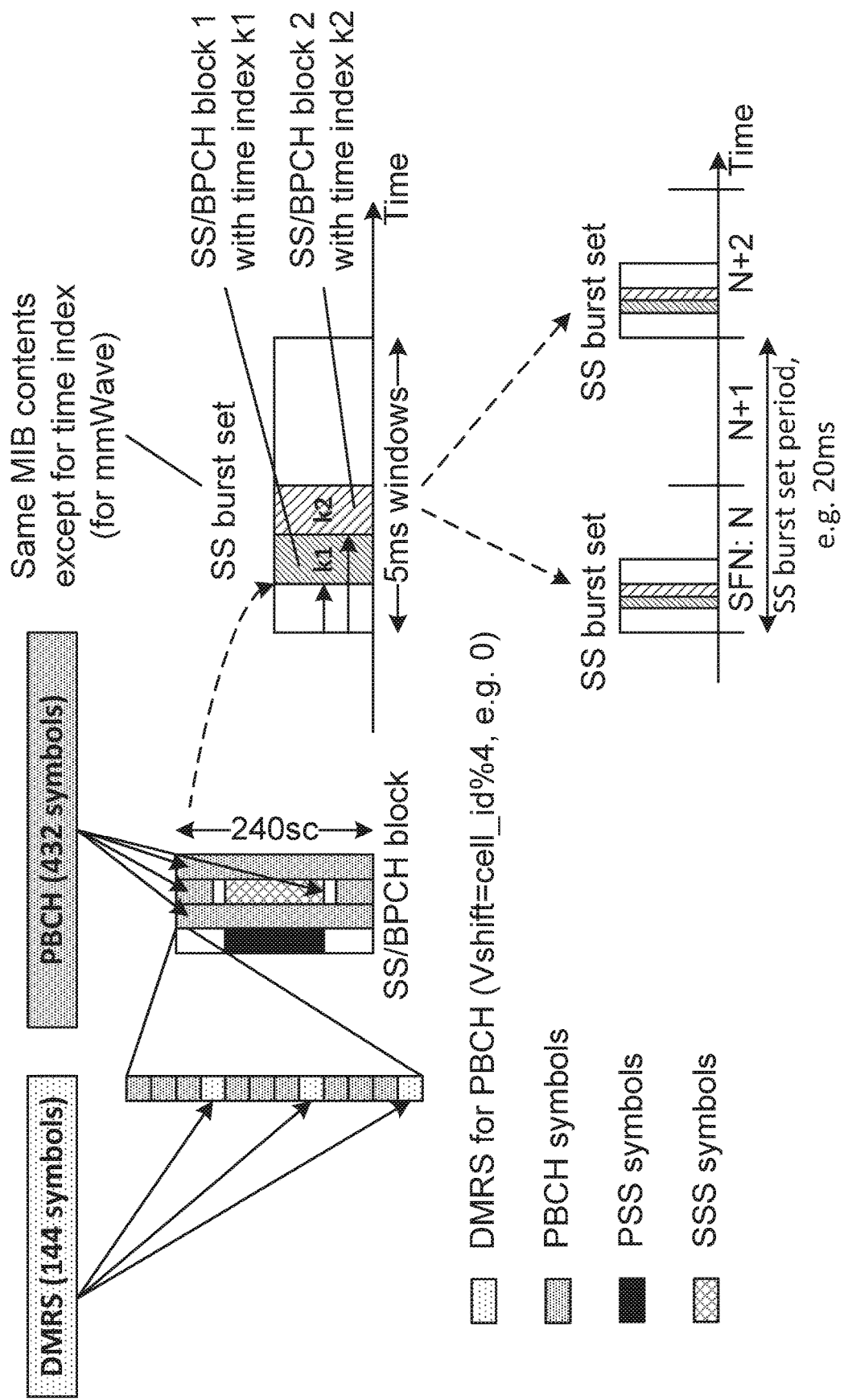
FIG. 1 is a schematic diagram illustrating an example of SS/PBCH block structure and two SS/PBCH blocks transmission within one SS burst, according to existing methods.
Figure 2:
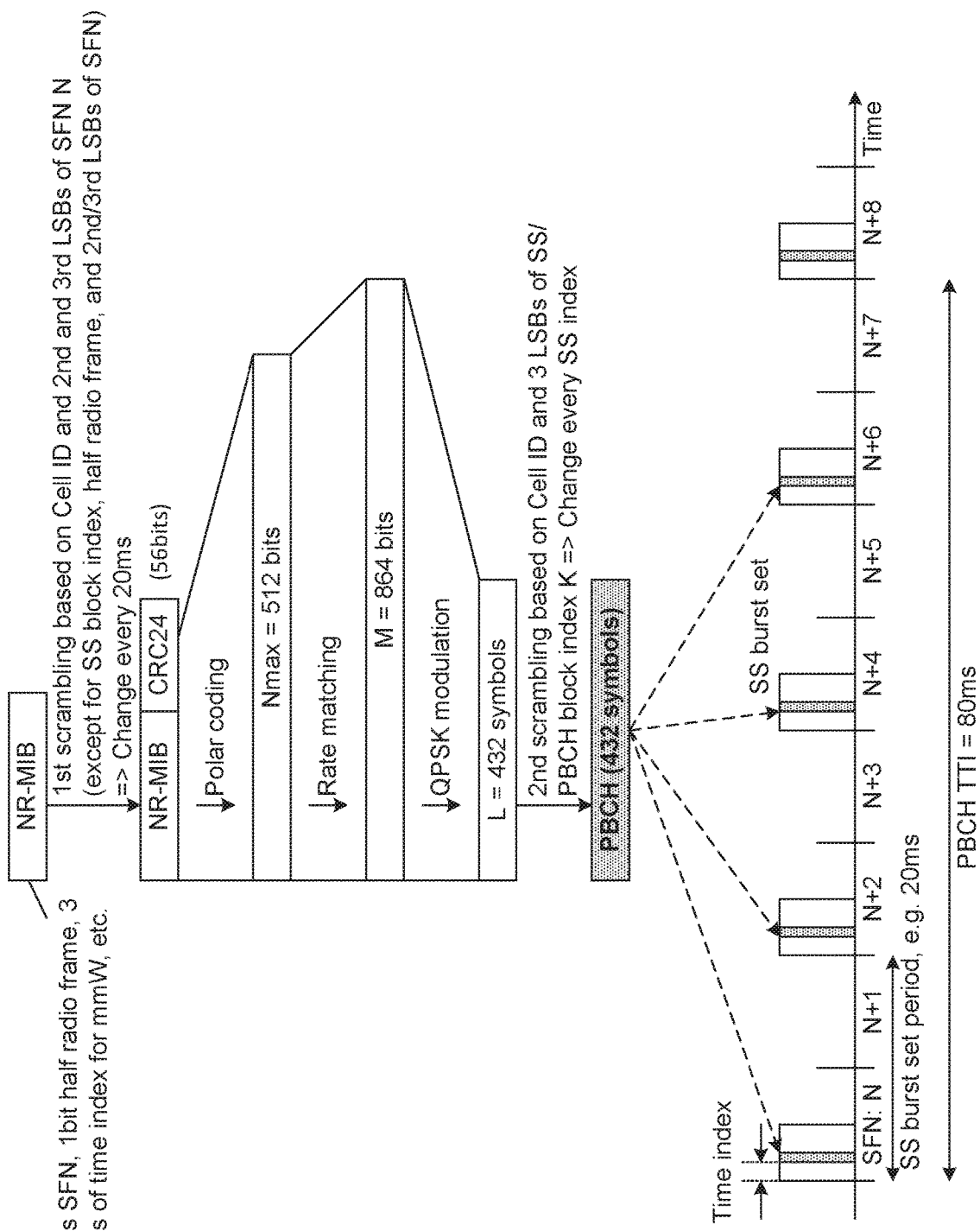
FIG. 2 is a schematic diagram illustrating an example of BCH transport channel processing and mapping to the physical broadcast channel, according to existing methods.
Figure 3:
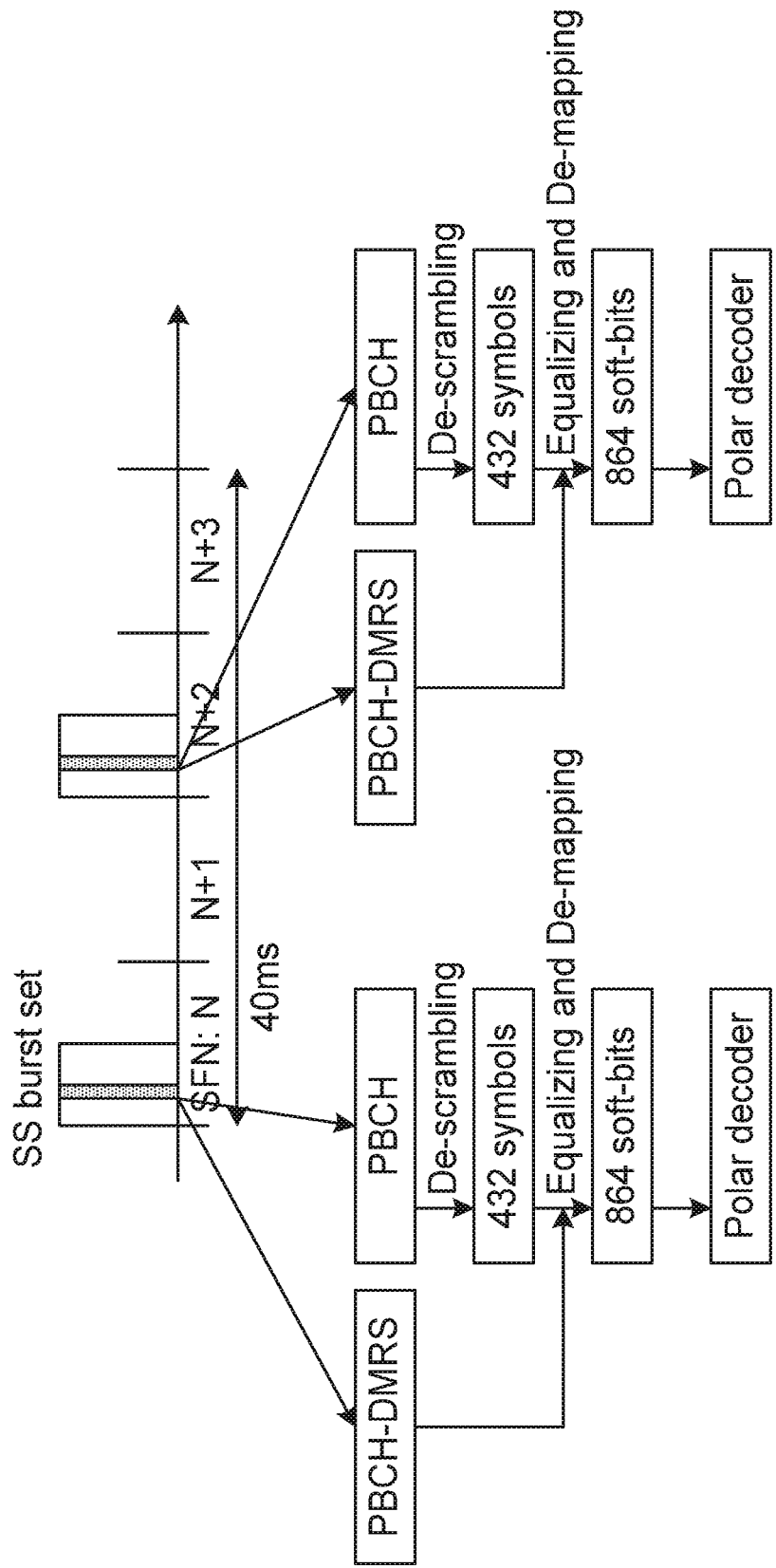
FIG. 3 is a block diagram illustrating an example of a method of PBCH single-shot receiver, according to existing methods.
Figure 4:
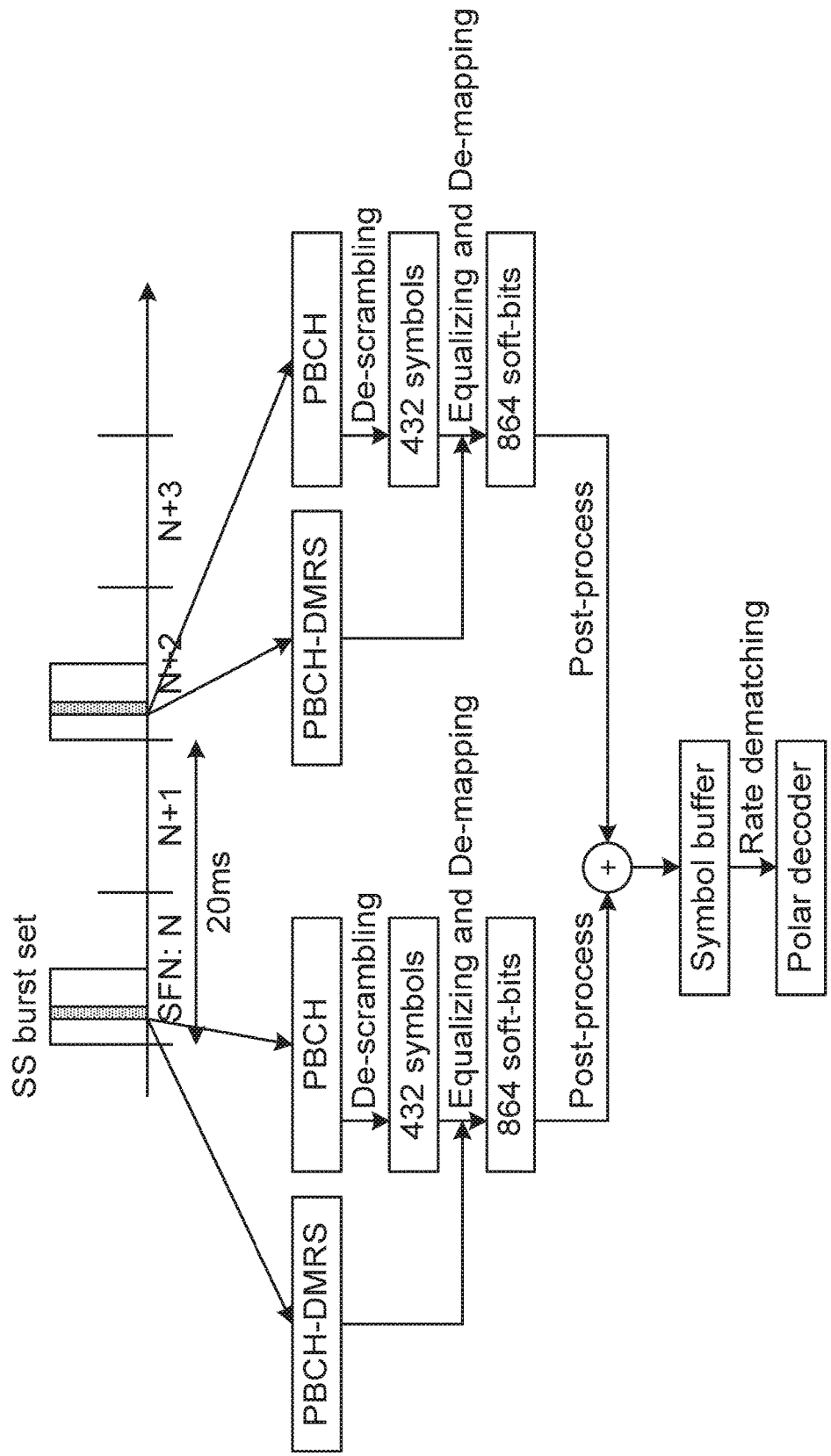
FIG. 4 is a block diagram illustrating an example of a method of PBCH soft-combining as performed by a receiver, according to existing methods.

As part of the development of embodiments herein, one or more problems with the existing technology will first be identified and discussed.

As explained earlier, there are two methods for NR PBCH decoding; single shot decoding and soft-combining decoding. Moreover, a UE may choose soft-combining with 2, 3, or 4 consecutive PBCH combining. The PBCH decoding performance for different methods depends on the scenario, e.g., center frequency, fading channel, signal quality level, e.g., Signal to noise radio (SNR). This means that, in some scenarios the single shot decoder performance may be better than the soft-combining decoder, and in other scenarios, the soft-combining decoder may be better. In existing methods, a UE uses single or multiple shots for combining based on SNR. For example, under higher SNR it may use single shot, while under lower SNR it may use multiple shots.

Certain aspects of the present disclosure and their embodiments may provide solutions to this challenge or other challenges. There are, proposed herein, various embodiments which address one or more of the issues disclosed herein.

Embodiments herein may be understood to address this problem in existing methods by providing an adaptive NR PBCH decoding method.

Some of the embodiments contemplated will now be described more fully hereinafter with reference to the accompanying drawings, in which examples are shown. In this section, the embodiments herein will be illustrated in more detail by a number of exemplary embodiments. Other embodiments, however, are contained within the scope of the subject matter disclosed herein. The disclosed subject matter should not be construed as limited to only the embodiments set forth herein; rather, these embodiments are provided by way of example to convey the scope of the subject matter to those skilled in the art. It should be noted that the exemplary embodiments herein are not mutually exclusive. Components from one embodiment may be tacitly assumed to be present in another embodiment and it will be obvious to a person skilled in the art how those components may be used in the other exemplary embodiments.

General Description/Terminology

In some embodiments, a non-limiting term UE or a wireless device are used interchangeably. The UE herein may be any type of wireless device capable of communicating with network node or another UE over radio signals. The UE may also be radio communication device, target device, device to device (D2D) UE, machine type UE or UE capable of machine to machine communication (M2M), low-cost and/or low-complexity UE, a sensor equipped with UE, Tablet, mobile terminal, smart phone, laptop embedded equipped (LEE), laptop mounted equipment (LME), USB dongles, Customer Premises Equipment (CPE) etc.

Also in some embodiments, generic terminology, such as "radio network node", is used. It may be any kind of a radio network node which may comprise any of base station, radio base station, base transceiver station, base station controller, network controller, RNC, evolved Node B (eNB), Node B, Multi-cell/multicast Coordination Entity (MCE), relay node, access point, radio access point, Remote Radio Unit (RRU) Remote Radio Head (RRH), NR Node B (eNB), etc. . . .

In some embodiments, the UE may be configured with PCell and PSCell or with PCell, PSCell and one or more SCells, such as in carrier aggregation or dual connectivity. The configured cells may be UE specific, a.k.a. serving cells of the UE.

A physical channel comprises of a set of resource elements carrying information originating from higher layers e.g., transport channel, Radio Resource Control (RRC) message etc. Examples of downlink physical channels are Physical Downlink Shared Channel (PDSCH), Physical Broadcast Channel (PBCH), Physical Multicast Channel (PMCH), Physical Control Format Indicator Channel (PC-FICH), Physical Downlink Control Channel (PDCCH), Physical Hybrid ARQ Indicator Channel (PHICH), Enhanced Physical Downlink Control Channel (EPDCCH), Machine Type Communication MPDCCH (MPDCCH), NR PDCCH (NPDCCH), NR PDSCH (NPDSCH), NR PBCH (NPBCH) etc.

The term PBCH used herein may correspond to any type of broadcast channel in which carriers may broadcast related higher layer information e.g., Broadcast Control Channel (BCCH), Master information block (MIB), System information block (SIB) etc.

The term time resource used herein may correspond to any type of physical resource or radio resource expressed in terms of length of time. Examples of time resources are: symbol, time slot, subframe, radio frame, TTI, interleaving time, special subframe, Uplink pilot Time Slot (UpPTS) etc.

Note that although terminology from LTE/5G has been used in this disclosure to exemplify the embodiments herein, this should not be seen as limiting the scope of the embodiments herein to only the aforementioned system. Other wireless systems with similar features, may also benefit from exploiting the ideas covered within this disclosure.

Figure 5:
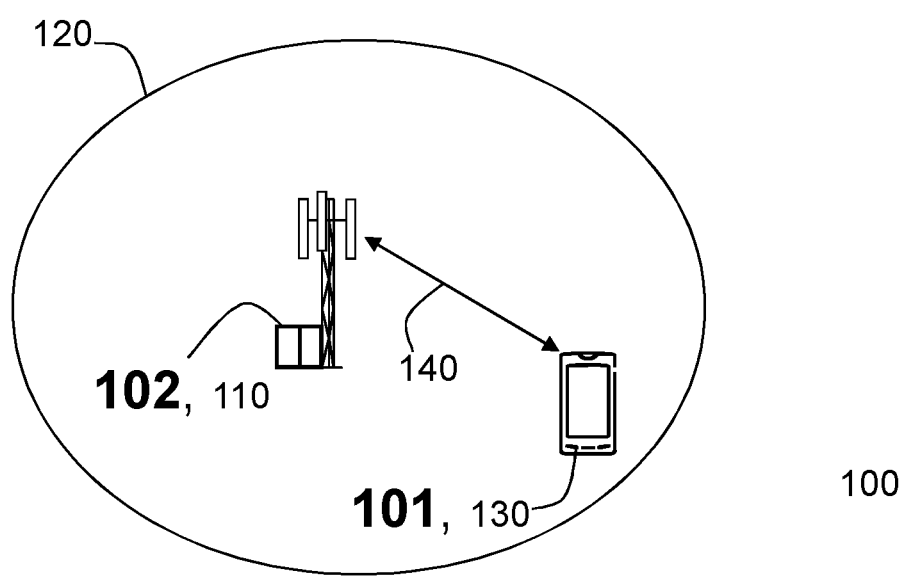
FIG. 5 is a schematic diagram illustrating a communications network, according to embodiments herein.

FIG. 5 depicts a non-limiting example of a communications network 100, sometimes also referred to as a wireless communications network, wireless communications system, cellular radio system, or cellular network, in which embodiments herein may be implemented. The wireless communications network 100 may typically be a 5G system, 5G network, or Next Gen System or network. The wireless communications network 100 may support other technologies such as, for example, Long-Term Evolution (LTE), LTE-Advanced/LTE-Advanced Pro, e.g. LTE Frequency Division Duplex (FDD), LTE Time Division Duplex (TDD), LTE Half-Duplex Frequency Division Duplex (HD-FDD), LTE operating in an unlicensed band, Wideband Code Division Multiple Access (WCDMA), Universal Terrestrial Radio Access (UTRA) TDD, Global System for Mobile Communications (GSM) network, GSM/Enhanced Data Rate for GSM Evolution (EDGE) Radio Access Network (GERAN) network, Ultra-Mobile Broadband (UMB), EDGE network, network comprising of any combination of Radio Access Technologies (RATs) such as e.g. Multi-Standard Radio (MSR) base stations, multi-RAT base stations etc., any 3rd Generation Partnership Project (3GPP) cellular network, WiFi networks, Worldwide Interoperability for Microwave Access (WiMax), or any cellular network or system. Thus, although terminology from 5G/NR and LTE may be used in this disclosure to exemplify embodiments herein, this should not be seen as limiting the scope of the embodiments herein to only the aforementioned system. The wireless communications network may also be understood as a non-cellular system, comprising network nodes which may serve receiving nodes, such as wireless devices, with serving beams. This may be a typical case, e.g., a in a 5G network.

The communications network 100 comprises a plurality of communication devices or nodes, whereof a first communication device 101, and a second communication device 102 are depicted in the non-limiting example of FIG. 5. The second communication device 102 may typically be a network node, such as a network node 110 described below, e.g., a base station. The first communication device 101 may typically be a wireless device, such as the wireless device 130 described below.

In other examples which are not depicted in FIG. 5, any of the first communication device 101 and the second communication device 102 may be wireless devices such as the wireless device 130, e.g., D2D devices. In yet other examples which are not depicted either in FIG. 5, any of the first communication device 101 and the second communication device 102 may be network nodes such as the network node 110.

The communications network 100 comprises a plurality of network nodes, whereof a network node 110 is depicted in the non-limiting example of FIG. 5. The network node 110 may be a radio network node. That is, a transmission point such as a radio base station, for example a New Radio (NR) NodeBs (gNBs), an eNB, or any other network node with similar features capable of serving a wireless device, such as a user equipment or a machine type communication device, in the communications network 100.

The communications network 100 covers a geographical area which may be divided into cell areas, wherein each cell area may be served by a network node, although, one radio network node may serve one or several cells. The communications network 100 comprises at least a cell 120. In the non-limiting example depicted in FIG. 5, the network node 110 serves the cell 120. Even in examples wherein the communications network 100 may not be referred to as a cellular system, if the network node 110 serves receiving nodes, such as the wireless device 130, with serving beams, the areas of coverage of the beams may still be referred to as cells. The network node 110 may be of different classes, such as, e.g., macro eNodeB, home eNodeB or pico base station, based on transmission power and thereby also cell size. The network node 110 may support one or several communication technologies, and its name may depend on the technology and terminology used. In NR, the network node 110, which may be referred to as a gNB, may be directly connected to one or more core networks, which are not depicted in FIG. 5 to simplify the Figure. In some examples, the network node 110 may be a distributed node, such as a virtual node in the cloud, and it may perform its functions entirely on the cloud, or partially, in collaboration with a radio network node.

A plurality of wireless devices are located in the wireless communication network 100, whereof a wireless device 130, which may also be referred to as a device, is depicted in the non-limiting example of FIG. 5. The wireless device 130 comprised in the communications network 100 may be a wireless communication device such as a UE, or a 5G UE, which may also be known as e.g., a mobile terminal, wireless terminal and/or mobile station, a mobile telephone, cellular telephone, or laptop with wireless capability, just to mention some further examples. Any of the wireless devices comprised in the communications network 100 may be, for example, portable, pocket-storable, hand-held, computer-comprised, or a vehicle-mounted mobile device, enabled to communicate voice and/or data, via the RAN, with another entity, such as a server, a laptop, a Personal Digital Assistant (PDA), or a tablet, Machine-to-Machine (M2M) device, device equipped with a wireless interface, such as a printer or a file storage device, modem, or any other radio network unit capable of communicating over a radio link in a communications system. The wireless device 130 comprised in the communications network 100 is enabled to communicate wirelessly in the communications network 100. The communication may be performed e.g., via a RAN, and possibly the one or more core networks, which may comprised within the communications network 100.

The first communications device 101 may be configured to communicate within the communications network 100 with the second communication device 102 over a link 140, e.g., a radio link.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

In general, the usage of "first", "second", "third", "fourth" and/or "fifth" herein may be understood to be an arbitrary way to denote different elements or entities, and may be understood to not confer a cumulative or chronological character to the nouns they modify.

Several embodiments are comprised herein. It should be noted that the examples herein are not mutually exclusive. Components from one embodiment may be tacitly assumed to be present in another embodiment and it will be obvious to a person skilled in the art how those components may be used in the other exemplary embodiments.

More specifically, the following are: a) embodiments related to a first communication device, such as the first communication device 101, e.g., a UE; and b) embodiments related to a second communication device, such as the second communication device 102, e.g., an eNB. The first communication device 101 may also be referred to as a wireless device, and the second communication device 102 may also be referred to as a network node.

Figure 6:
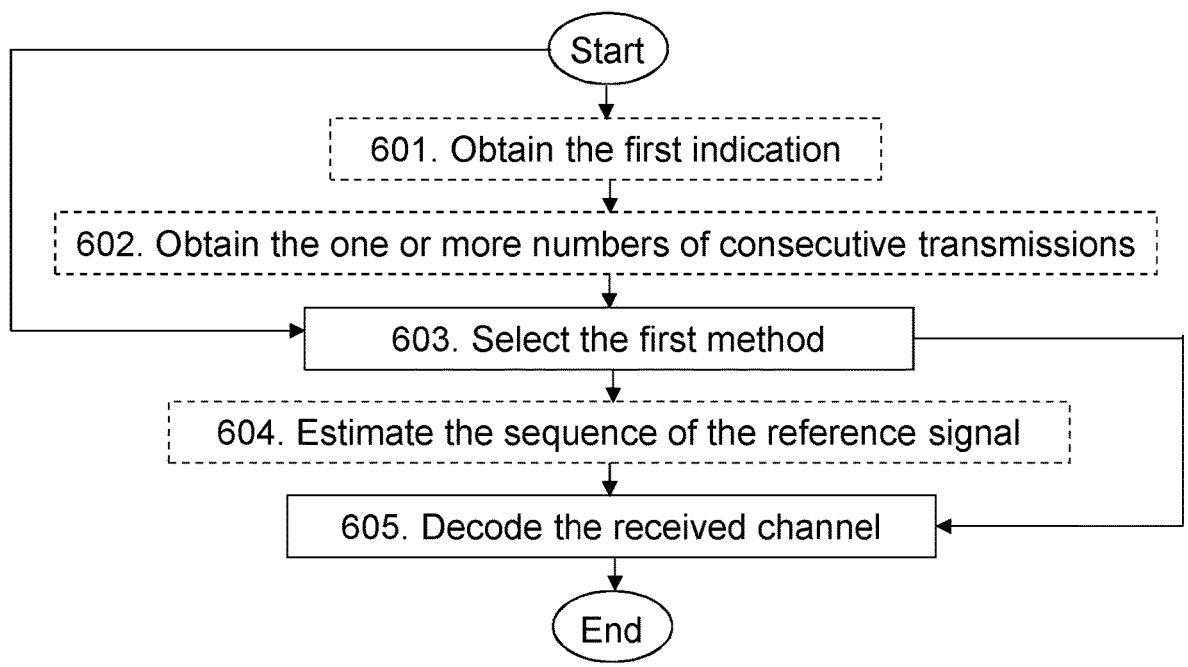
FIG. 6 is a flowchart depicting a method in a first communication device, according to embodiments herein.

Embodiments of a method, performed by the first communication device 101, will now be described with reference to the flowchart depicted in FIG. 6. The method may be considered to be for handling decoding of a channel. The first communication device 101 operates in the communications network 100. The communications network 100 may operate on New Radio, NR.

In some embodiments all the actions may be performed. In some embodiments, two or more actions may be performed. One or more embodiments may be combined, where applicable. All possible combinations are not described to simplify the description. In FIG. 6, optional actions are indicated with dashed lines. Some actions may be performed in a different order than that shown in FIG. 6.

Action 601

In the course of communications in the communications network 100, the first communication device 101 may receive information from the second communication device 102 that it may need to decode. Particularly, the first communication device 101 may try to decode a broadcast channel, e.g., a physical broadcast channel, e.g., the PBCH.

Further particularly, in some examples, the first communication device 101 may obtain a request to receive a broadcast channel of an SS burst in the cell 120. For example, the first communication device 101 may receive a request from the second communication device 102 to acquire a new Cell Global Identifier (CGI) at the inter-frequency measurement or intra-frequency measurement. Another example is when the first communication device 101 may turn on the power or get back from a long sleep mode, and may need to access to the communications network 100, e.g., as part of the initial cell acquisition, cell selection procedure etc. During this stage, the first communication device 101 may first find the strongest beam and to decode PSS/SSS to synchronize with the second communication device 102, and may then receive a request internally in the first communication device 101 through a higher layer to acquire NR-MIB. In yet another example, the first communication device 101 may acquire the broadcast channel of a target cell during a cell change procedure. Examples of cell change procedures are cell reselection to the target cell, RRC connection release with redirection, handover, RRC re-establishment etc. In yet another example, the first communication device 101 may acquire the broadcast channel of a serving cell, such as the cell 120, if there is any change in the content of the serving cell; the first communication device 101 may receive a notification on a paging channel to read the System Information (SI) of the serving cell. It may be noted that in the description herein, the cell 120 may be used as an example of a cell the first communication device 101 may acquire the PBCH from. However, it may be understood that embodiments herein apply to PBCH decoding of any cell, e.g., a neighbor cell, unless otherwise noted.

The first communication device 101 may be able to choose from a plurality of methods to decode, and may therefore need to make a choice of method of decoding, according to some criterion or criteria. In embodiments herein, the plurality of methods to decode the physical broadcast channel comprises: a) single-shot decoding only, b) soft-combining decoding only, and c) both single-shot decoding and soft-combining decoding simultaneously.

In NR, the transmissions of the physical broadcast channel may be received by the first communication device 101 in different beams. As stated earlier, each beam may have its own SS/PBCH block transmission. The second communication device 102, as also described earlier, may transmit different SS/PBCH blocks with different timing within a 5 ms window, in such a way that the transmission of the physical broadcast channel in one beam may have a different time index than in another beam.

In order of the first communication device 101 to be able to use the soft-combining method of decoding, the first communication device 101 may need to combine the SS/PBCH blocks from different SS burst sets that have the same time index, that is, that are transmitted in the same beam. If the first communication device 101 were to be unable to obtain the time index of the SS/PBCH block, it may decide that refrain from choosing the soft-combining methods to decode the physical broadcast channel.

According to the foregoing, in order to enable the first communication device 101 to decide on the decoding method, in this Action 601, the first communication device 101 may obtain a first indication.

In some embodiments, the first indication may be obtained from the second communication device 102.

The obtaining in this Action 601, which may be understood as receiving, may be performed via the link 140, e.g., in the embodiments wherein the first communication device 101 may obtain the first indication from the second communication device 102. Alternatively, the first communication device 101 may obtain the first indication autonomously, e.g., based on pre-defined information, or on history or statistics, as will be further explained later.

The first indication may indicate at least one of: a) a time index of a synchronization signal and PBCH block (SS/PBCH block) for transmitting primary and secondary synchronization signals, and the physical broadcast channel, b) a set of correspondences, e.g., a table, or a list, between a first set of physical cell identify information of the second communication device 102 operating in the communications network 100 and a second set of time indexes of SS/PBCH blocks configured in the secondary communication device 102, and c) a reference signal sequence used for the physical broadcast channel demodulation.

Regarding option a), the first communication device 101, e.g., a UE, may, for example, know the time index information based on any of the following: i) based on pre-defined information e.g., pre-defined mapping between the PCI of the cell 120 and the range of time index of beams used in the cell 120, see the description of the method performed by the second communication device 102, and ii) history or statistics. For example, if the first communication device 101 has detected certain time index in the same cell 120 in the past. For example, if the first communication device 101 is acquiring broadcast channel of the cell 120 which has also been re-selected by the first communication device 101 in the past, e.g., within the last X1 seconds.

As for option b), the set of correspondences may be e.g., that depicted in Table 1. Table 1 is an example of PCI time index configuration, that is, an example of how the PCI of the cell 120 may map to the time index. The second communication device 102 may setup beams and transmit SS bursts according to the configuration table 1. For example, in a frequency above 6 GHz (e.g., in FR2), the second communication device 102, e.g., a Network node A, may configure 10 beams and it may use the time index numbers from 0 to 9. Another network node, e.g., Network node B, may configure 6 beams and it may use the time index numbers 40 to 45.

TABLE 1

Example of PCI/time index configuration table.

| Configuration | PCI | Number of beams | Used time indexes |
|---|---|---|---|
| 1 | 0 | 10 | 0-9 |
| 2 | 34 | 6 | 40-45 |
| 3 | 94 | 3 | 10, 14-15 |
| 4 | ... | ... | ... |

As for option c), for example, the first communication device 101 may receive from the second communication device 102 a signal with the 3 LSBs of the SSB index only to command neighbouring beam search, e.g., instead of transmitting the full SSB index of 6 bits. For example, for FR1, configuring up to 8 SS/BPCH blocks, it may be sufficient to receive a transmission of 3 LSB only. The first communication device 101 may otherwise use history or statistics.

By performing this Action 601, the first communication device 101 may be enabled to decide whether it may be able to consider the soft-combining method as a possible option of methods to decode the physical broadcast channel or not. Stated more generally, by obtaining the first indication in this Action 601, the first communication device 101 may obtain assistance information to be able to perform the selection of methods to decode the physical broadcast channel which will be described later, in Action 603.

Action 602

If the first communication device 101 were to choose the method to decode the physical broadcast channel of soft-combining, the first communication device 101 may also, as explained earlier, be able to choose the a different number of consecutive transmissions, e.g., 2, 3, or 4 to use for the soft-combining. In this Action 602, the first communication device 101 may obtain one or more numbers of consecutive transmissions of the physical broadcast channel for soft-combining decoding.

The obtaining in this Action 602 may be performed autonomously, or based on another indication, which may be referred to herein as a third indication, received from the second communication device 102 operating in the communications network 100. If the third indication is received from the second communication device 102, the first communication device 101 may obtain the third communication via the link 140.

By performing this Action 602, the first communication device 101 may be enabled to dynamically choose itself the number of consecutive transmissions of the physical broadcast channel for soft-combining decoding, or it may be enabled to be assisted by the second communication device 102 in making that choice.

Action 603

In this Action 603, the first communication device 101 selects a method, e.g., a first method, to decode the broadcast channel, e.g., the physical broadcast channel from, the plurality of methods to decode the broadcast channel, or the physical broadcast channel. As stated above, the plurality of methods to decode the physical broadcast channel comprises: a) single-shot decoding only, b) soft-combining decoding only, and c) both single-shot decoding and soft-combining decoding simultaneously. The selecting in this Action 603 is based on whether or not a time index of a synchronization signal and physical broadcast channel block (SS/PBCH block), for transmitting primary and secondary synchronization signals and a physical broadcast channel is known by the first communication device 101. This may be understood to mean that if the first communication device 101 knows the time index, it may be enabled to choose one of the methods comprising the use of soft-combining, as it may know which SS/PBCH blocks to combine in time. Otherwise, if the first communication device 101 does not know the time index, it may decide that it is not enabled to choose one of the methods comprising the use of soft-combining, and therefore refrain from using such methods. If the first communication device 101 has no information such as time index, or SNR, the first communication device 101 may decide to try both single shot and soft-combining.

In some embodiments, the physical broadcast channel may be a PBCH. Depending of the RAT used by the communications network 100, the physical broadcast channel may have a name other than PBCH, while having a similar function.

In some embodiments, the selecting in this Action 603 may be based on the obtained first indication in Action 601. This may be understood to mean that the first indication may enable the first communication device 101 to know the time index of the SS/PBCH block, for transmitting primary and secondary synchronization signal.

In some embodiments, the selecting in this Action 603 may be based on at least one of: a) an autonomous decision; b) a pre-defined rule; and c) a second indication received from the second communication device 102 operating in the communications network 100. The second indication may indicate the first method, as selected by the second communication device 102.

In some embodiments, the selecting in this Action 603 may be triggered by the request to receive the physical broadcast channel, as explained above, from one of: a) the higher layer in the first communication device 101, and b) the second communication device 102 operating in the communications network 100.

Selection Based on One or More Properties of a Radio Channel

The selecting in this Action 603 may be further based on one or more properties of a radio channel the physical broadcast channel is received on from the second communication device 102 operating in the communications network 100.

The one or more properties of the radio channel may comprise a fourth indication of at least one of: a) a quality of a signal received from the second communication device 102, e.g., SNR, SINR, Reference signal received power (RSRP)/Reference signal received quality (RSRQ), etc, b) a condition of the radio channel, channel dispersion, etc. . . . , and c) a speed of the first communication device 101, e.g., Doppler, for example, e.g., based on a velocity of the first communication device 101.

Each of these three options will be described next.

With regards to the option a), example of quality information may be: SS/PBCH block strength level, SNR, Signal to interference and noise ratio (SINR), Channel dispersion, UE mobility, center frequency etc.

Accordingly, in some examples, the first communication device 101 may obtain the channel quality of the SS burst for which the first communication device 101 may be trying to decode the PBCH. The term obtaining used herein may correspond to any of: acquiring, measuring estimating, receiving, determining, retrieving etc. For example, the first communication device 101 may measure the signal level from the SSS in the same SS burst. Examples of signal levels are signal strength, e.g., such as RSRP, and signal quality, e.g., such as RSRQ, SNR, SINR, etc. In another example, if the first communication device 101 already knows the time index information of the SS burst, then the first communication device 101 may retrieve the signal level estimated based on the Channel state indicator reference signal (CSI-RS) or the SSS with the same time index, as determined by the first communication device 101, from the memory, for example, RSRP, RSRQ, SNR, SINR previously measured by the first communication device 101. In yet another example, with regards to the option b), if the first communication device 101 knows the time index information of the SS burst, the first communication device 101 may retrieve the radio characteristics, e.g., channel quality information, such as channel dispersion and delay spread e.g., expressed in terms of multipath delay profile such as 1 μs. In yet another example, with regards to the option c), the first communication device 101 may obtain the velocity information of the first communication device 101. For example, the first communication device 101 may retrieve the velocity information stored in the memory of the first communication device 101, or acquire it from an outside source such as the Global Navigation Satellite System (GNSS), or acceleration sensors or by receiving information from the second communication device 102. The term velocity may also be called herein as the speed of the first communication device 101, e.g. expressed in distance per unit time, Doppler frequency etc.

Once the he first communication device 101 may have obtained the one or more properties of the radio channel the physical broadcast channel may be received on from the second communication device 102, the first communication device 101 may decide the PBCH decoding method based on the measured quality acquired. The first communication device 101 may use the information to decide the PBCH decoding method depending on any one or more of the following mechanisms, as described earlier: a) based on one or more pre-defined conditions or rules, and b) based on a configuration message received from the second communication device 102 such as the second indication, e.g. the second communication device 102 may configure, e.g., according to Action 601, the first communication device 101, e.g. via RRC signaling etc, whether to apply method 1, 2 or 3. Examples of methods 1, 2 and 3 may be: method 1: Single-shot decoding only, method 2: Soft-combing decoding only, and method 3: Both single-shot decoding and soft-combining decoding simultaneously.

Table 2 and Table 3 are the examples of the predefined conditions or rule. Table 2 is an example when the first communication device 101 may only know the SS/PBCH strength level, e.g., initial cell search. In this case, the first communication device 101 may know at least the SS/PBCH strength level based on the SSS. According to the predefined strength level criteria, e.g., high, middle, low, the predefined PBCH decoding method may be designed, for example, single shot and/or soft-combining. Examples of low, middle and high signal levels in terms of SNR/SINR are expressed in Table 3.

TABLE 2

Example of PBCH decoding method wherein the the first communication device 101 only knows the SS/PBCH strength level

| Configuration | SS/PBCH block strength level | PBCH decoding |
|---|---|---|
| 1 | High | Single-shot |
| 2 | Middle | Single-shot/Soft-combining (N = 2) |
| 3 | Low | Soft-combing (N = 2) and Soft-combing (N = 4) |

TABLE 3

Examples of SS/PBCH strength level (Sr) ranges in terms of a signal metric e.g., SNR/SINR

| SS/PBCH block strength level | Sr in dB |
|---|---|
| High | Sr ≥ 0 |
| Middle | −3 ≤ Sr < 0 |
| Low | −6 ≤ Sr < −3 |

Table 4 is another example wherein the first communication device 101 may have more knowledge on the SS/PBCH block where the first communication device 101 may be decoding. In this case, the first communication device 101 may use more information such as SNR/SINR, channel dispersion, and UE mobility e.g. UE velocity. If SNR is low, low channel dispersion, and low UE mobility, the first communication device 101 may use soft-combining PBCH decoder with 2 and 4 consecutive SS/PBCH blocks. Examples of different levels of the magnitude of channel dispersion (Dr) ranges in terms of delay spread are shown in Table 5.

TABLE 4

Example of PBCH decoding method wherein the UE knows the SS/PBCH time index

| Config-uration | SNR/SINR | Channel dispersion | UE mobility | PBCH decoding |
|---|---|---|---|---|
| 1 | Low | Low | Low | Soft-combing (2) and Soft-combing (N = 4) |
| 2 | Low | Low | High | Single-shot and Soft-combining (N = 2) |
| 3 | Low | High | — | Single-shot |
| 4 | High | — | — | Single-shot |
| 5 | ... | ... | ... | ... |

TABLE 5

Examples of the magnitude of channel dispersion (Dr) ranges in terms of a dispersion metric e.g. delay spread

| Channel dispersion level | Dr in μs |
|---|---|
| High | Dr ≥ 1 |
| Middle | 0.2 ≤ Dr ≤ 1 |
| Low | Dr < 0.2 |

Examples of different levels of the magnitude of the UE velocity (V) ranges in terms of km/hour are shown in Table 6.

TABLE 6

Examples of the magnitude of UE velocity (V) ranges in terms of a velocity metric e.g. km/hour

| Channel dispersion level | V in km/hour |
| --- | --- |
| High | V ≥ 200 |
| Middle | 30 ≤ Dr < 200 |
| Low | Dr < 30 |

By selecting the first method to decode the physical broadcast channel in this Action 603, the first communication device 101 is enabled to adaptively select the method, avoiding to perform all possible decoding methods. Therefore, the broadcasted information may be acquired more quickly, and with power efficiency. Consequently, processing and energy resources in the communications network 100 may be used more efficiently.

Action 604

In this Action 604, the first communication device 101 may estimate a sequence of a reference signal received within the received physical broadcast channel, or the SS/PBCH block.

The reference signal may be a demodulation reference signal.

For PBCH-DMRS sequence estimation, the first communication device 101 may generate possible PBCH-DMRS sequence(s) and find the most probable DMRS sequence.

Example

One example of DMRS estimation process is as follows:

For the example, it may be considered the received DMRS symbols in the SS/PBCH block is g(i), i=0 ... N-1, and used DMRS sequence with time index t is $p_t(i)$, where N is the number of DMRS symbols. The first communication device 101 may generate the candidate DMRS sequences $p_k(i)$, k∈Q, where Q is the set of time index candidates.

If the first communication device 101 knows the DMRS time index candidates, e.g., based on the received information and/or a pre-defined mapping table between PCI and used DMRS time index set, then the first communication device 101 may set Q according to the signaled table. If the first communication device 101 does not know the DMRS time index candidates, the first communication device 101 may set Q depending on the center frequency, for example, for below 3 GHz, Q={0, 1, 2, 3}, for the frequency above 3 GHz and below 6 GHz, Q={0, 1, ... , 7} and for the frequency above 6 GHz, Q={0, 1, ... , 63}.

The first communication device 101 may calculate the metric for each candidate t∈Q:

$$h_t(i) = p_t^*(i) \cdot g(i)$$

$$m_t = \frac{1}{N} \sum_i |h_t(i)|^2$$

The first communication device 101 may decide the time index which maximizes the metric:

time_index=arg max($m_t$)

Action 604 is optional. The reference signal, e.g., DMRS, may be understood to map to the time index of the SS/PBCH block. By estimating the sequence of the reference signal received within the received physical broadcast channel in this Action 604, the first communication device 101 may be enabled to derive the time index of the SS/PBCH block in embodiments wherein the time index may not have been known by the first communication device 101 when selecting the first method in Action 603. In some embodiments, the first communication device 101 may have selected the soft-combining method of detection based on e.g., the SNR being high. In such a case, the first communication device 101 may not have used the index to select the decoding method. By estimating the sequence of the reference signal in this Action 604, and then deriving the time index, the first communication device 101 may then be enabled to combine PBCH samples which have the same index during the soft-combining method, or expressed differently, for combining the same beams occurring at different times in the cell.

Action 605

In this Action 605, the first communication device 101 decodes, or processes, the received broadcast channel, e.g., the received physical broadcast channel based on the selected first method.

In some embodiments, wherein the selected method may have been one of b) soft-combining decoding only, and c) both single-shot decoding and soft-combining decoding simultaneously, and wherein the first communication device 101 may have obtained the one or more numbers of consecutive transmissions of the physical broadcast channel for soft-combining decoding in Action 602, the decoding in this Action 605 may be further based on the obtained one or more numbers. In such embodiments, the obtaining in Action 602 may be performed autonomously, or based on a third indication received from the second communication device 102 operating in the communications network 100.

Examples of steps that may be performed by the first communication device 101, as part of this Action 605 may be:

a) the first communication device 101 receives the PBCH symbols;

b) the first communication device 101 descrambles the 2nd scrambling with the scrambling code generated based on SS/PBCH time index and Cell ID;

c) the first communication device 101 equalizes the PBCH symbols from the channel estimation calculated from PBCH-DMRS;

d) the first communication device 101 de-maps based on QPSK and generate soft-bit sequence;

e) If the first communication device 101 receiver is configured as single-shot decoding, the first communication device 101 may perform rate de-matching and Polar decoding;

f) If the first communication device 101 receiver is configured as soft-combining, the first communication device 101 may accumulate the M soft-bit sequences from the M consecutive SS/PBCH blocks. M may be for example, 2, 3, 4. Then, the first communication device 101 may perform rate de-matching and Polar decoding.

The first communication device 101 may use the PBCH after decoding the PBCH, e.g., after acquiring time index, SFN etc, for performing one or more tasks or operations or procedures. Examples of such tasks may be:

a) Transmitting the obtained information in the PBCH to the second communication device 102;

b) Using the determined information, that is, the determined information, for acquiring cell global ID of a target cell;

c) Using the determined information for acquiring additional broadcast related information e.g. system information block (SIB) such as SIB1 etc;

b) Using the determined information for performing a cell selection or a cell change procedure e.g. cell reselection etc.

By, in this Action 605, decoding the received physical broadcast channel based on the selected first method, the first communication device 101 may be enabled to perform the decoding using the most optimal method, given the current circumstances the first communication device 101 may be in, in a dynamic fashion.

In any of the Actions just described, the physical broadcast channel may be the PBCH, and the communications network 100 may operate on NR.

Figure 7:
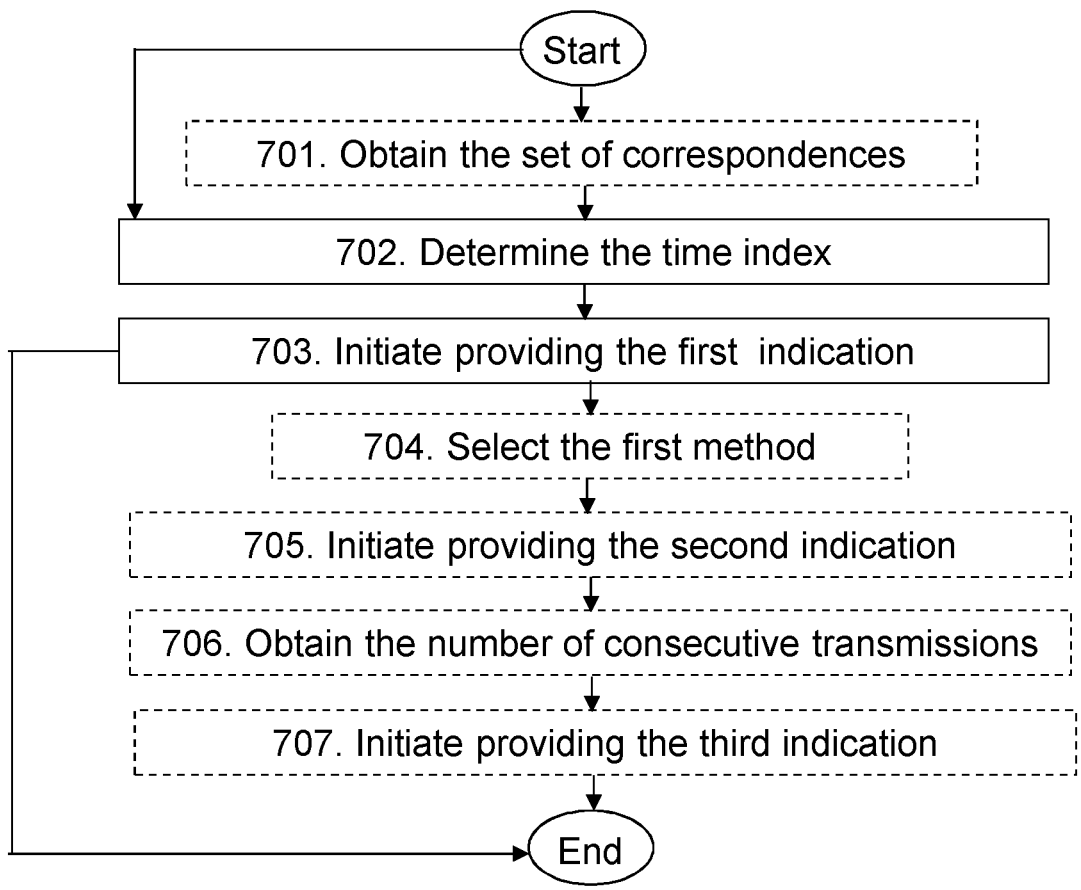
FIG. 7 is a flowchart depicting a method in a second communication device, according to embodiments herein.

Embodiments of a method, performed by the second communication device 102, will now be described with reference to the flowchart depicted in FIG. 7. The method may be considered to be handling decoding of a channel. The second communication device 102 operates in the communications network 100.

In some embodiments all the actions may be performed. In some embodiments, two or more actions may be performed. One or more embodiments may be combined, where applicable. All possible combinations are not described to simplify the description. In FIG. 7, optional actions are indicated with dashed lines. Some actions may be performed in a different order than that shown in FIG. 7.

The detailed description of some of the following corresponds to the same references provided above, in relation to the actions described for the first communication device 101, and will thus not be repeated here to simplify the description, however, it may be understood to equally apply. For example, the communications network 100 may operate on NR.

Action 701

In this Action 701, the second communication device 102 obtains the set of correspondences, e.g., the table, or the list, between the first set of physical cell identity information of the second communication device 102 and the second set of time indexes of synchronization signal and physical broadcast channel (SS/PBCH) blocks configured in the secondary communication device 102.

Generating may also be understood as any of creating, determining, obtaining, retrieving, e.g., from a memory, or calculating. The second communication device 102 may determine the association between the first set of physical cell identity information of the second communication device 102 and the second set of time indexes of synchronization signal and physical broadcast channel (SS/PBCH) blocks configured in the secondary communication device 102 based on one or more parameters or scenarios. Examples of parameters may be a number of beams that may be required to transmit in the cell 120, a carrier frequency that may be used in the cell 120 etc. For example, at carriers above a certain threshold, e.g., 3 GHz, the number of required beams may be larger than a certain threshold, e.g., more than 4. Examples of scenarios may be cell size or deployment scenario. For example, in cells of smaller size and in dense areas, a larger number of beams may be used to avoid interference in neighboring cells.

By obtaining the set of correspondences in this Action 701, the second communication device 102 may then be enabled to provide it to the first communication device 101, to assist it to, in turn, select the method of decoding.

Action 702

In this Action 702, the second communication device 102 determines the time index of the synchronization signal and PBCH block (SS/PBCH block) for transmitting primary and secondary synchronization signals and the broadcast channel, e.g., the physical broadcast channel to the first communication device 101 operating in the communications network 100.

In some embodiments, the determining in this Action 702 may be based on a number of configured SS/PBCH blocks and their transmission timings in the second communication device 102.

According to an example, the second communication device 102 may decide, e.g., according to Action 701, the number of the SS/PBCH blocks within one SS burst according to the configured beams, and may decide, e.g., according to Action 702, the time index for each SS/PBCH block. The decision may be based on one or more criteria. In one example, the decision may be related to the carrier frequency of the cell 120. For example, when the center frequency of the cell 120 is above 6 GHz, which may be also referred to as frequency range 2 (FR2), mmWave range etc., the total number of beams may be very large, e.g., up to 64 beams. This means the first communication device 101 may need to detect the time index of the beam it may be in, from a very large number of possible beams. As explained earlier, the specific time index that may be used in a particular beam may be determined based, e.g., on the deployment scenario. This increases the complexity of the first communication device 101 and may also delay the acquisition of the time index. Therefore, the mapping, e.g., according to Action 701, and/or 702, between the physical cell ID (PCI) and the time index related information may be pre-defined, or configured at the first communication device 101 by the second communication device 102. Table 1, shown before, is an example of PCI time index configuration. The second communication device 102 may setup beams and transmit SS burst according to the configuration shown in Table 1. In one example, the table may be pre-defined.

By determining the time index in this Action 702, the second communication device 102 may then be enabled to provide it to the first communication device 101, to assist it to in turn select the method of decoding, and enable it to avoid having to attempt to detect the time index of one beam from a very large number of possible beams.

Action 703

In this Action 703, the second communication device 102 initiates providing the first indication of the determined time index of the SS/PBCH block to the first communication device 101. The first indication provided to the first communication device 101 is based on the generated set of correspondences.

The initiating providing may be understood herein as triggering, starting, or enabling the providing. Providing may be understood as e.g., sending, which may be performed via the link 140. The second communication device 102 may provide the first indication, for example, via a message which may be transmitted using one or more of: RRC signalling, MAC signalling, and downlink control information (DCI).

In an example, the second communication device 102 may also signal the set of correspondences, e.g., Table 1, to the first communication device 101, or other UEs, e.g., according to Action 703. In the latter case, the second communication device 102 may have more flexibility in terms of setting the cell PCI, number of beams and also the time indexes. This may be understood to be because the table may be understood to not be pre-defined, but rather to be generated by the second communication device 102 or another communication device.

In agreement with the foregoing, in some embodiments, the first indication may further indicate one of: a) the reference signal sequence used for the physical broadcast channel demodulation, and b) the set of correspondences between the first set of physical cell identify information of the second communication device 102 and the second set of time indexes of SS/PBCH blocks configured in the secondary communication device 102.

By providing the first indication in this Action 703, the second communication device 102 enables the first communication device 101 to select the method of decoding based on the first indication. If the mapping is signalled, then the first communication device 101 may be enabled to use this for acquiring the PCBH of a neighbor cell; but not during the initial cell search e.g., when the first communication device 101 is powered on.

Action 704

In this Action 704, the second communication device 102 may select the method, e.g., the first method, to be used by the first communication device 101 to decode the broadcast channel, e.g., the physical broadcast channel, from the plurality of methods to decode the physical broadcast channel. The plurality of methods to decode the physical broadcast channel may comprise a) single-shot decoding only, b) soft-combining decoding only, and c) both single-shot decoding and soft-combining decoding simultaneously. The selecting in this Action 704 may be based on the determined time index of the SS/PBCH block in Action 702, or on the generated set of correspondences in Action 701. The second communication device 102 may for example, choose any method, and override any selection of method in the first communication device 101. For example, if the SNR is high, based on a measurement report, the second communication device 102 may then indicate to the first communication device 101 to use only single shot.

In some embodiments, the selecting 704 may be based on at least one of: the one or more properties of the radio channel the physical broadcast channel is transmitted on by the second communication device 102, and the mobility of the first communication device 101. The selection of the method, e.g., 1, 2 or 3, e.g., according to this Action 704, may be based on the same criteria or conditions that are described in Tables 2-6 in relation to FIG. 5.

The one or more properties of the radio channel may comprise a fourth indication of at least one of: a) the quality of a signal transmitted by the second communication device 102 e.g., SNR, SINR, RSRP/RSRQ, etc quality, and b) the condition of the radio channel, e.g., channel dispersion, and c) the speed, or velocity, of the first communication device 101 e.g., Doppler.

The quality of the signal may be understood to be as estimated by the first communication device 101, and reported back to the second communication device 102.

By selecting the first method in this Action 704, the second communication device 102 may then be enabled to provide it to the first communication device 101, to assist it to in turn select the method of decoding.

Action 705

In this Action 705, the second communication device 102 may initiate providing 705 the second indication indicating the selected first method to the first communication device 101.

According to yet another aspect of examples herein, according to Action 705, the second communication device 102 may configure the first communication device 101, e.g., via RRC signaling, broad channel, MAC command, L1 signaling message, etc., with whether to apply method 1, 2 or 3 for decoding the PBCH of the cell 120.

By initiating providing the second indication in this Action 706, the second communication device 102 may enable the first communication device 101 to refrain from calculating itself the method of decoding.

Action 706

In this Action 706, the second communication device 102 may obtain the one or more numbers of consecutive transmissions of the physical broadcast channel for any of the b) soft-combining decoding only, and c) both single-shot decoding and soft-combining decoding simultaneously, methods.

By obtaining the one or more numbers of consecutive transmissions in this Action 706, the second communication device 102 may then be enabled to provide them to the first communication device 101, to assist it to in turn select the method of decoding.

Action 707

In this Action 707, the second communication device 102 may initiate providing 707 the third indication indicating the obtained one or more numbers to the first communication device 101.

The second communication device 102 may provide the third indication via a message which may be transmitted using one or more of: RRC signalling, MAC signalling, and downlink control information (DCI).

The second communication device 102, e.g., according to Action 707 as a particular example corresponding to Action 602, may further configure the first communication device 101 with the number (N) of consecutive SS/PBCH blocks to be used by the first communication device 101 for soft combining in order to decode the PBCH when using the soft combining method, e.g., method 2 or 3. Examples of N are, 2, 3, 4, 8 and 16.

The second communication device 102, according to this Action 707, may further configure the first communication device 101 with a certain number (N) of consecutive SS/PBCH blocks, which are to be used by the first communication device 101 for soft combining in order to decode the PBCH when using the soft combining method, e.g., method 2 or 3. Examples of N are, 2, 3, 4, 8 and 16.

In any of the Actions just described, the physical broadcast channel may be the PBCH, and the communications network 100 may operate on NR.

Examples

Some embodiments herein will now be described with some non-limiting examples. In the following description any reference to a/the UE may be understood to equally apply to the first communication device 101, and any reference to a/the network node, and/or a/the network may be understood to equally apply to the second communication device 102.

Method in UE

In some examples, the first communication device 101 may be a UE. The second communication device 102 may be a network node.

The steps performed in the UE may be, in a particular example:

Step 1: Obtaining a request to receive a broadcast channel of an SS burst in a cell. For example, the UE may receive request from the network node or internally in the UE through higher layer.

Step 2: Acquire the channel quality for which the SS burst UE is trying to decode PBCH.

Step 3: Deciding the PBCH decoding method, e.g., according to Action 603.

Step 4: Estimate PBCH-DMRS sequence, e.g., according to Action 604.

Step 5: Performing the PBCH decoding, e.g., according to Action 605

Step 1

In this step, the UE may obtain a request to receive a broadcast channel of an SS burst in a cell. For example, the UE may receive a request from the network node to acquire a new CGI at the inter-frequency measurement or intra-frequency measurement. Another example is when the UE may turn on the power or get back from a long sleep mode, and may need to access to the network, e.g., as part of the initial cell acquisition, cell selection procedure etc. During this stage, the UE the first find the strongest beam and to decode PSS/SSS to synchronize with the network and may then receive a request internally in the UE through higher layer to acquire NR-MIB. In yet another example, the UE may acquire the broadcast channel of a target cell during a cell change procedure. Examples of cell change procedures are cell reselection to the target cell, RRC connection release with redirection, handover, RRC re-establishment etc. In yet another example, the UE may acquire the broadcast channel of a serving cell if there is any change in the content of the serving cell; the UE may receive a notification on a paging channel to read the SI of the serving cell.

Step 2

In this step, the UE may obtain the channel quality of the SS burst for which the UE may be trying to decode PBCH. The term obtaining used herein may correspond to any of: acquiring, measuring estimating, receiving, determining, retrieving etc. For example, the UE may measure the signal level from the SSS in the same BB burst. Examples of signal levels are signal strength, e.g., such as RSRP, and signal quality, e.g., such as RSRQ, SNR, SINR etc. In another example, if the UE already knows the time index information of the SS burst, then the UE may retrieve the signal level estimated based on CSI-RS or SSS with the same time index, as determined by the UE, from the memory, for example, RSRP, RSRQ, SNR, SINR previously measured by the UE. In yet another example, if the UE knows the time index information of SS burst, the UE may retrieve the radio characteristics, e.g., channel quality information, such as channel dispersion and delay spread e.g., expressed in terms of multipath delay profile such as 1 μs. In yet another example, the UE may obtain the UE velocity information. For example, the UE may retrieve the velocity information stored in the UE memory or acquire it from an outside source such as GNSS or acceleration sensors or by receiving information from the network node. The term velocity may also be called herein as the UE speed e.g., expressed in distance per unit time, Doppler frequency etc.

The UE may know the time index information based on any of the following:
- Based on pre-defined information e.g. pre-defined mapping between PCI of the cell and the range of time index of beams used in the cell (see the section entitled "Method in the network"),
- History or statistics. For example if the UE has detected certain time index in the same cell in the past. For example if the UE is acquiring broadcast channel of the cell which has also been re-selected by the UE in the past e.g. within the last X1 seconds.

Step 3

In this step, UE may decide the PBCH decoding method based on the measured quality acquired in step 2. The UE may use the information to decide the PBCH decoding method depending on any one or more of the following mechanisms:

Based on one or more pre-defined conditions or rules and
Based on configuration message received from the network node e.g. the network node may configure, e.g., according to Action 601, the UE, e.g., via RRC signaling etc, whether to apply method 1, 2 or 3. The network node, e.g., according to Action 707 as a particular example corresponding to Action 602, may further configure the UE with the number (N) of consecutive SS/PBCH blocks to be used by the UE for soft combining in order to decode the PBCH when using the soft combining method, e.g., method 2 or 3. Examples of N are, 2, 3, 4, 8 and 16.

Examples of methods 1, 2 and 3 are expressed below:
Method 1: Single-shot decoding only
Method 2: Soft-combing decoding only
Method 3: Both single-shot decoding and soft-combining decoding simultaneously.

Example of quality information may be: SS/PBCH block strength level, SNR, SINR, Channel dispersion, UE mobility, center frequency etc.

Table 2 and 3, as presented above, are the examples of the predefined conditions or rule. Table 2 is an example when the UE only knows the SS/PBCH strength level, e.g., initial cell search. In this case, may UE may know at least SS/PBCH strength level based on SSS. According to the pre-defined strength level criteria, e.g., high, middle, low, the predefined PBCH decoding method may be designed, for example, single shot and/or soft-combining. Examples of low, middle and high signal levels in terms of SNR/SINR are expressed in Table 3.

Table 4, as presented above, is another example wherein the UE has more knowledge on the SS/PBCH block where the UE is decoding. In this case, the UE may use more information such as SNR/SINR, channel dispersion, and UE mobility e.g. UE velocity. If SNR is low, low channel dispersion, and low UE mobility, the UE may use soft-combining PBCH decoder with 2 and 4 consecutive SS/PBCH blocks. Examples of different levels of the magnitude of channel dispersion (Dr) ranges in terms of delay spread are shown in Table 5, shown above.

Examples of different levels of the magnitude of the UE velocity (V) ranges in terms of km/hour are shown in Table 6.

Step 4

In this step, the UE may estimate the PBCH-DMRS sequence. For PBCH-DMRS sequence estimation, the UE may generate possible PBCH-DMRS sequence(s) and find the most probable DMRS sequence.

One example of DMRS estimation process is as follows:
Consider the received DMRS symbols in the SS/PBCH block is g(i), i=0 . . . N−1, and used DMRS sequence with time index t is $p_t(i)$, where N is the number of DMRS symbols. The UE may generate the candidate DMRS sequences $p_k(i)$, k∈Q, where Q is the set of time index candidates.

If the UE knows the DMRS time index candidates, e.g., based on the received information and/or pre-defined mapping table between PCI and used DMRS time index set, then the UE may set Q according to the signaled table. If the UE does not know the DMRS time index candidates, the UE may set Q depending on the center frequency, for example, for below 3 GHz, Q={0, 1, 2, 3}, for the frequency above 3 GHz and below 6 GHz, Q={0, 1, . . . , 7} and for the frequency above 6 GHz, Q={0, 1, . . . , 63}.

The UE may calculate the metric for each candidate t∈Q:

$$h_t(i) = p_t^*(i) \cdot g(i)$$

$$m_t = \frac{1}{N} \sum_i |h_t(i)|^2$$

The UE may decide the time index which maximize the metric:

time_index=arg max($m_t$)

Step 5

In this step, the UE may perform the PBCH decoding according to the PBCH decoding method selected by the UE in the previous step. Examples of steps performed in the UE may be:

the UE receives the PBCH symbols
the UE descrambles the 2nd scrambling with the scrambling code generated based on SS/PBCH time index and Cell ID.
the UE equalizes the PBCH symbols from the channel estimation calculated from PBCH-DMRS.
the UE de-maps based on QPSK and generate soft-bit sequence.
If the UE is configured as single-shot decoding, the UE may perform rate de-matching and Polar decoding.
If may UE is configured as soft-combining, may UE may accumulate the M soft-bit sequences from the M consecutive SS/PBCH blocks. M may be for example, 2, 3, 4. Then the UE may perform rate de-matching and Polar decoding.

The UE may use the PBCH after decoding the PBCH, e.g., after acquiring time index, SFN etc, for performing one or more tasks or operations or procedures. Examples of such tasks may be:

Transmitting the obtained information in the PBCH to the network node,
Using the determined information for acquiring cell global ID of the target cell,
Using the determined information for acquiring additional broadcast related information e.g. system information block (SIB) such as SIB1 etc.
Using the determined information for performing a cell selection or a cell change procedure e.g. cell reselection etc.

Method in the Network

According to another example, the network node may decide, e.g., according to Action 701, the number of the SS/PBCH blocks within one SS burst according to the configured beams, and may decide, e.g., according to Action 702, the time index for each SS/PBCH block. The decision may be based on one or more criteria. One example may be related to the carrier frequency of the cell. For example, when the center frequency of the cell is above 6 GHz. This may be also called as frequency range 2 (FR2), mmWave range etc. In this case, the total number of beams may be very large e.g. up to 64 beams. This means the UE may need to detect the time index of the beam from very larger number of possible beams. This increases the UE complexity and may also delay the acquisition of the time index. Therefore mapping, e.g., according to Action 701, and/or 702, between physical cell ID (PCI) and the time index related information may be pre-defined or configured at the UE by the network node. For example, in a frequency above 6 GHz (e.g. in FR2), the network node A may configure 10 beams and it may use the time index numbers from 0 to 9. And Network node B may configure 6 beams and it use the time index numbers 40 to 45. Table 1, as presented above, is an example of PCI time index configuration.

The network node may setup beams and transmit SS burst according to the configuration table 1. In one example, the table may be pre-defined. In another example, the network may also signal this table to the UEs, e.g., according to Action 703. In the latter case, the network node may have more flexibility in terms of setting the cell PCI, number of beams and also the time indexes. If the mapping is signalled, then the UE may use this for acquiring the PCBH of the neighbor cell; but not during the initial cell search e.g. when the UE is powered on.

According to yet another aspect of this embodiment, the network node may configure the UE, e.g., via RRC signaling, broad channel, MAC command, L1 signaling message, etc., whether to apply method 1, 2 or 3 for decoding the PBCH of the cell, e.g., according to Action 705. The network node may further configure the UE with a certain number (N) of consecutive SS/PBCH blocks, which are to be used by the UE for soft combining in order to decode the PBCH when using the soft combining method, e.g., method 2 or 3, e.g., according to Action 707. Examples of N are, 2, 3, 4, 8 and 16. The selection of the method, e.g., 1, 2 or 3, e.g., according to Action 704, may be based on the same criteria or conditions are described in tables 2-6 in the section entitled "Method in UE".

Figure 8:
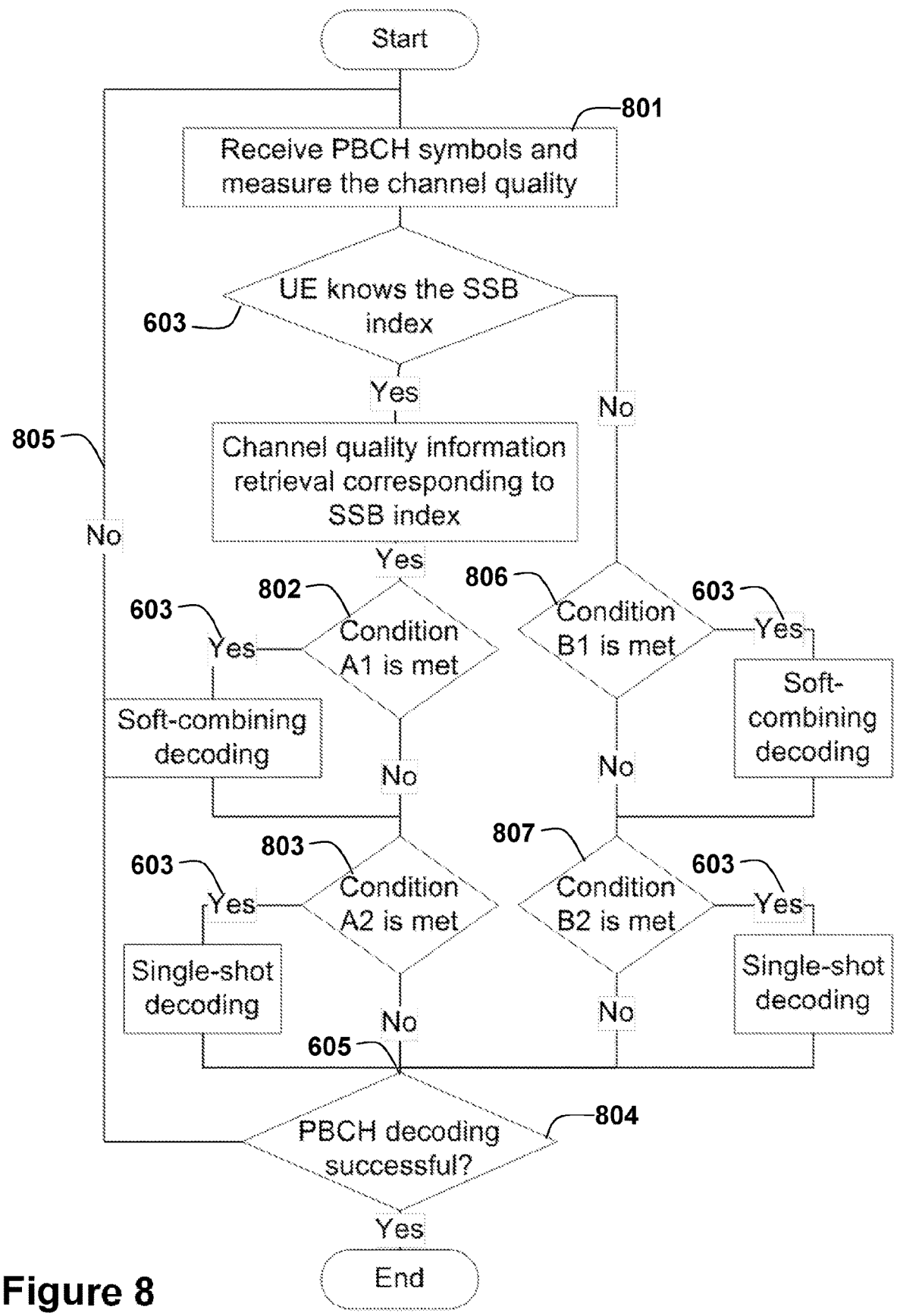
FIG. 8 is a flowchart depicting a method in a first communication device, according to embodiments herein.

FIG. 8 is a schematic flowchart of a non-limiting example of a method in the first communication device 101, a UE in this example, according to embodiments herein. The particular example of FIG. 8 illustrates a flowchart for PBCH receiver selection according to the knowledge of SSB time index and other channel conditions. At 801, the first communication device 101 receives PBCH symbols from the second communication device 102 and measures the channel quality. At 603, based on whether or not the first communication device 101 knows or not the time index, denoted as SSB index in the Figure, the first communication device 101 follows a flow of Actions or another. If the first communication device 101 knows the time index, the first communication device 101 checks whether a certain condition A1 is met or not at 802. Condition A1 may be, for example, that the estimated PBCH SNR level is 'low'. If condition A1 is met, the first communication device 101 chooses the Soft-combining method, and checks if the decoding of the PBCH was successful or not at 804. If condition A1 is not met, the first communication device 101 checks whether another condition A2 is met or not at 803. Condition A2 may be, for example, that the estimated PBCH SNR level is 'high', or that the estimated PBCH SNR level is 'low' and the estimated velocity of the first communication device 101 is 'High'. If condition A2 is met, the first communication device 101 chooses the single-shot method, and and checks if the decoding of the PBCH was successful or not at 804. If condition A2 is not met, the first communication device 101 concludes that the decoding of the PBCH was not successful, and starts the process again at 805. If the first communication device 101 does not know the time index, the first communication device 101 checks whether a certain condition B1 is met or not at 806. Condition B1 may be, for example, that the estimated SS/PBCH block strength level is 'middle' or 'low'. If condition B1 is met, the first communication device 101 chooses the Soft-combining method, and checks if the decoding of the PBCH was successful or not at 804. If condition B1 is not met, the first communication device 101 checks whether another condition B2 is met or not at 807. Condition B2 may be, for example, that the estimated SS/BPCH block strength level is 'middle' or 'high'. If condition B2 is met, the first communication device 101 chooses the single-shot method and checks if the decoding of the PBCH was successful or not at 804. If condition B2 is not met, the first communication device 101 concludes that the decoding of the PBCH was not successful, and starts the process again at 805.

As a brief overview of embodiments herein, in a first embodiment, the first communication device 101 may select one the plurality of the PBCH decoding methods, and use the selected method for decoding the PBCH. Method 1 may be single-shot decoding only, method 2 may be soft-combing decoding only, and method 3 may be both single-shot decoding and soft-combining decoding simultaneously.

The selection of one of the PBCH decoding methods may be based on any one or more of: autonomous decision by the first communication device 101, based on an indication or message received from the second communication device 102, and pre-defined rule.

In one example embodiment, the first communication device 101 may select the number (N) of consecutive PBCH transmissions for soft-combining decoding when the first communication device 101 uses method 2 or method 3. The actual value of the parameter N may further depend on the selected method. Example of the number (N) of consecutive PBCH transmissions may be 2, 3, or 4.

In another embodiment, the first communication device 101 may estimate the PBCH-DMRS sequence according to the pre-configured knowledge about the association between the SS/PBCH block timing index candidates and the PCI of the cell e.g. based on history, pre-defined association or information received from the network node. According to one aspect of this embodiment the second communication device 102 may configure the mapping table which may associate a physical layer cell identity (PCI) and SS/PBCH timing index related information. The second communication device 102 may transmit SS/PBCH blocks according to the mapping table and it may also signal them to the first communication device 101, and similarly, to other UEs.

Certain embodiments may provide one or more of the following technical advantage(s), which may be summarized as follows: a communication device such as, e.g., a UE, may acquire NR-MIB quickly with power efficiency. Embodiments herein avoid that the UE need to perform all the possible decoding methods for acquiring MIB-NR as fast as possible.

Another advantage of embodiments herein is that they enable the number of PBCH-DMRS sequence candidates to be reduced. This may be understood to be because the relation between the cell IDs and DMRS that may be used may be pre-defined or signaled to the first communication device 101. The first communication device 101 may first detect the cell, e.g., the cell 120, that is, it may first determine the cell ID. Then, the first communication device 101 may have to detect only those DMRS which are associated with the cell ID, as indicated in the pre-defined or signaled information. This helps to improve time index acquisition success rate and PBCH decoding success rate. This may be understood to be because the first communication device 101 may determine the SSB index from the sequence which may maximize the correlation between the candidate sequences, e.g., 8 sequences for FR1, and received PBCH DMRS sequence. If the number of candidates is reduced, e.g., 8=>4, the detection rate may also be improved.

Figure 9:
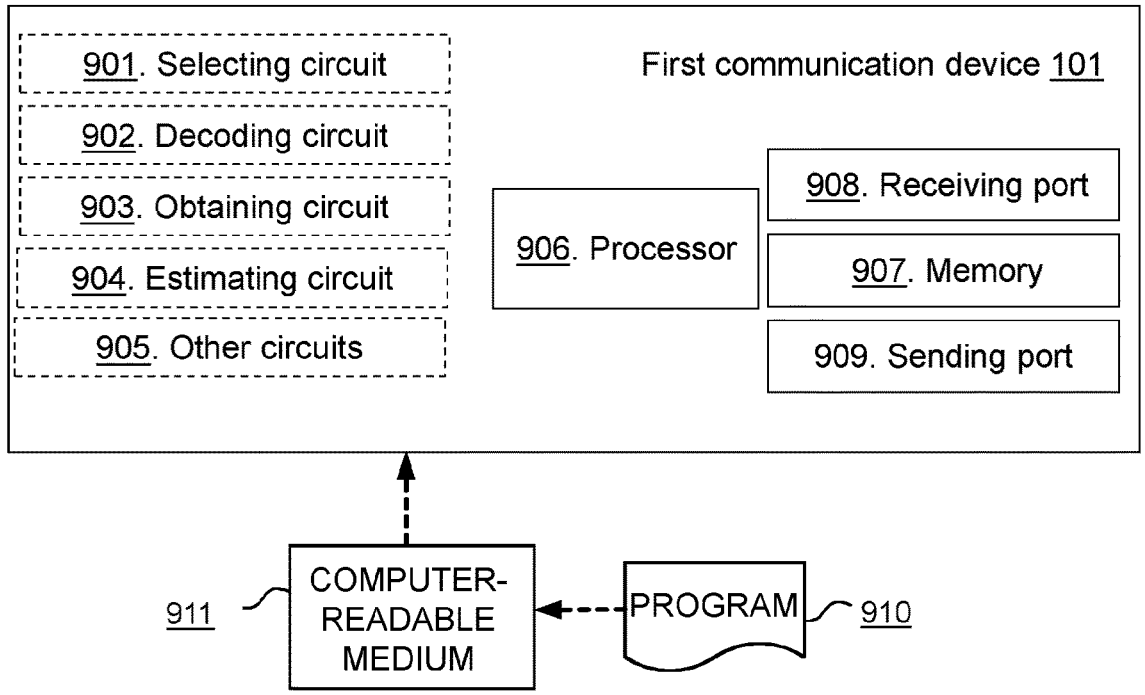
FIG. 9 is a schematic block diagram illustrating two non-limiting examples, a) and b), of a first communication device, according to embodiments herein.
Figure 9:
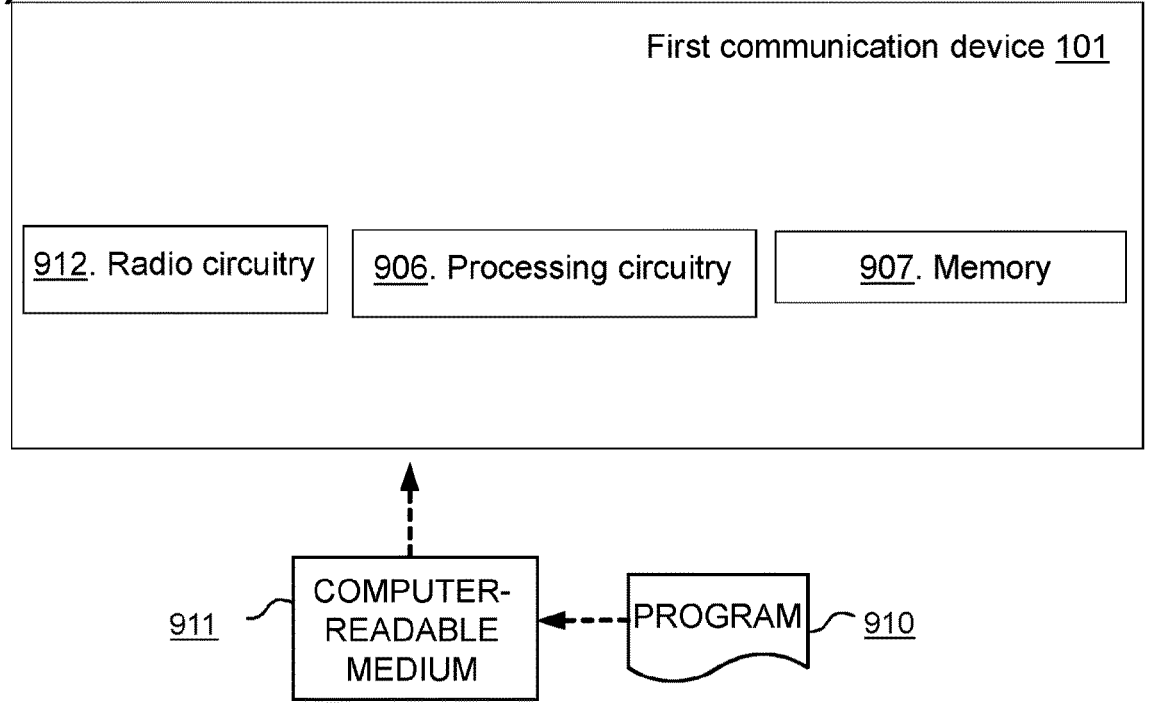

FIG. 9 depicts two different examples in panels a) and b), respectively, of the arrangement that the first communication device 101 may comprise to perform the method actions described above in relation to FIG. 6. In some embodiments, the first communication device 101 may comprise the following arrangement depicted in FIG. 9a. The first communication device 101 may be configured to handle decoding of a channel. The first communication device 101 is configured to operate in the communications network 100.

Several embodiments are comprised herein. Components from one embodiment may be tacitly assumed to be present in another embodiment and it will be obvious to a person skilled in the art how those components may be used in the other exemplary embodiments. The detailed description of some of the following corresponds to the same references provided above, in relation to the actions described for the first communication device 101, and will thus not be repeated here. For example, the physical broadcast channel may be configured to be the PBCH, and the communications network 100 may be configured to operate on NR.

In FIG. 9, optional circuits are indicated with dashed boxes.

The first communication device 101 is configured to perform the selecting of Action 603, e.g. by means of a selecting circuit 901 within the first communication device 101, configured to select the method to decode the physical broadcast channel from the plurality of methods to decode the physical broadcast channel. The plurality of methods to decode the physical broadcast channel is configured to comprise: a) single-shot decoding only, b) soft-combining decoding only, and c) both single-shot decoding and soft-combining decoding simultaneously. To select is configured to be based on whether or not the time index of a synchronization signal and physical broadcast channel block, SS/PBCH block, for transmitting primary and secondary synchronization signals and the physical broadcast channel is known by the first communication device 101. The selecting circuit 901 may be a processor 906 of the first communication device 101, or an application running on such processor.

In some embodiments, to select may be configured to be triggered by the request to receive the physical broadcast channel from one of: a) the higher layer in the first communication device 101, and b) the second communication device 102 configured to operate in the communications network 100.

The first communication device 101 is further configured to perform the decoding of Action 605, e.g. by means of a decoding circuit 902 within the first communication device 101, configured to decode the physical broadcast channel configured to be received based on the method configured to be selected. The decoding circuit 902 may be the processor 906 of the first communication device 101, or an application running on such processor.

In some embodiments, the first indication may be configured to indicate at least one of: a) the time index of the synchronization signal and PBCH block (SS/PBCH block) for transmitting primary and secondary synchronization signals and the physical broadcast channel, b) the set of correspondences, between the first set of physical cell identify information of the second communication device 102 configured to operate in the communications network 100 and the second set of time indexes of SS/PBCH blocks configured in the secondary communication device 102, and c) the reference signal sequence configured to be used for the physical broadcast channel demodulation. To select may be further configured to be based on the first indication configured to be obtained.

The first communication device 101 may be configured to perform the obtaining of Action 601, e.g. by means of an obtaining circuit 903 within the first communication device 101, configured to obtain the first indication from the second communication device 102. The obtaining circuit 903 may be the processor 906 of the first communication device 101, or an application running on such processor.

In some embodiments, to select may be further configured to be based on at least one of: a) the autonomous decision; b) the pre-defined rule; and c) the second indication configured to be received from the second communication device 102 configured to operate in the communications network 100.

In some embodiments wherein the method configured to be selected is one of b) soft-combining decoding only, and c) both single-shot decoding and soft-combining decoding simultaneously, the first communication device 101 may be further configured to the obtaining of Action 602, e.g. by means of the obtaining circuit 903 within the first communication device 101, configured to obtain the one or more numbers of consecutive transmissions of the physical broadcast channel for soft-combining decoding. To decode may be further configured to be based on the one or more numbers configured to be obtained. To obtain may be configured to be performed autonomously, or based on the third indication configured to be received from the second communication device 102 configured to operate in the communications network 100.

In some embodiments, to select may be further configured to be based on one or more properties of the radio channel the physical broadcast channel may be configured to be received on from the second communication device 102 configured to operate in the communications network 100.

In some embodiments, the one or more properties of the radio channel may be configured to comprise the fourth indication of at least one of: a) the quality of the signal configured to be received from the second communication device 102, b) the condition of the radio channel, and c) the speed of the first communication device 101.

The first communication device 101 may be configured to perform the estimating of Action 604, e.g. by means of an estimating circuit 904 within the first communication device 101, configured to estimate the sequence of the reference signal configured to be received within the physical broadcast channel configured to be received. The estimating circuit 904 may be the processor 906 of the first communication device 101, or an application running on such processor.

The reference signal may be configured to be the demodulation reference signal.

Other circuits 905 may be comprised in the first communication device 101.

The embodiments herein in the first communication device 101 may be implemented through one or more processors, such as a processor 906 in the first communication device 101 depicted in FIG. 9*a*, together with computer program code for performing the functions and actions of the embodiments herein. A processor, as used herein, may be understood to be a hardware component. The program code mentioned above may also be provided as a computer program product, for instance in the form of a data carrier carrying computer program code for performing the embodiments herein when being loaded into the first communication device 101. One such carrier may be in the form of a CD ROM disc. It is however feasible with other data carriers such as a memory stick. The computer program code may furthermore be provided as pure program code on a server and downloaded to the first communication device 101.

The first communication device 101 may further comprise a memory 907 comprising one or more memory units. The memory 907 is arranged to be used to store obtained information, store data, configurations, schedulings, and applications etc. to perform the methods herein when being executed in the first communication device 101.

In some embodiments, the first communication device 101 may receive information from, e.g., the second communication device 102, through a receiving port 908. In some embodiments, the receiving port 908 may be, for example, connected to one or more antennas in first communication device 101. In other embodiments, the first communication device 101 may receive information from another structure in the communications network 100 through the receiving port 908. Since the receiving port 908 may be in communication with the processor 906, the receiving port 908 may then send the received information to the processor 906. The receiving port 908 may also be configured to receive other information.

The processor 906 in the first communication device 101 may be further configured to transmit or send information to e.g., the second communication device 102, and/or another structure in the communications network 100, through a sending port 909, which may be in communication with the processor 906, and the memory 907.

Those skilled in the art will also appreciate that the selecting circuit 901, the decoding circuit 902, the obtaining circuit 903, the estimating 904, and the other circuits 905 described above may refer to a combination of analog and digital circuits, and/or one or more processors configured with software and/or firmware, e.g., stored in memory, that, when executed by the one or more processors such as the processor 906, perform as described above. One or more of these processors, as well as the other digital hardware, may be included in a single Application-Specific Integrated Circuit (ASIC), or several processors and various digital hardware may be distributed among several separate components, whether individually packaged or assembled into a System-on-a-Chip (SoC).

Also, in some embodiments, the different modules 901-905 described above may be implemented as one or more applications running on one or more processors such as the processor 906.

Thus, the methods according to the embodiments described herein for the first communication device 101 may be respectively implemented by means of a computer program 910 product, comprising instructions, i.e., software code portions, which, when executed on at least one processor 906, cause the at least one processor 906 to carry out the actions described herein, as performed by the first communication device 101. The computer program 910 product may be stored on a computer-readable storage medium 911. The computer-readable storage medium 911, having stored thereon the computer program 910, may comprise instructions which, when executed on at least one processor 906, cause the at least one processor 906 to carry out the actions described herein, as performed by the first communication device 101. In some embodiments, the computer-readable storage medium 911 may be a non-transitory computer-readable storage medium, such as a CD ROM disc, or a memory stick. In other embodiments, the computer program 910 product may be stored on a carrier containing the computer program 910 just described, wherein the carrier is one of an electronic signal, optical signal, radio signal, or the computer-readable storage medium 911, as described above.

The first communication device 101 may comprise a communication interface configured to facilitate communications between the first communication device 101 and other nodes or devices, e.g., the second communication device 102. The interface may, for example, include a transceiver configured to transmit and receive radio signals over an air interface in accordance with a suitable standard.

In other embodiments, the first communication device 101 may comprise the following arrangement depicted in FIG. 9b. The first communication device 101 may comprise a processing circuitry 906, e.g., one or more processors such as the processor 906, in the first communication device 101 and the memory 907. The first communication device 101 may also comprise a radio circuitry 912, which may comprise e.g., the receiving port 908 and the sending port 909. The processing circuitry 906 may be configured to, or operable to, perform the method actions according to FIG. 6, FIG. 8, and/or FIGS. 12-16, in a similar manner as that described in relation to FIG. 9a. The radio circuitry 912 may be configured to set up and maintain at least a wireless connection with the second communication device 102. Circuitry may be understood herein as a hardware component.

Hence, embodiments herein also relate to the first communication device 101 operative to operate in the communications network 100. The first communication device 101 may comprise the processing circuitry 906 and the memory 907, said memory 907 containing instructions executable by said processing circuitry 906, whereby the first communication device 101 is further operative to perform the actions described herein in relation to the first communication device 101, e.g., in FIG. 6, FIG. 8, and/or FIGS. 12-16.

Figure 10:
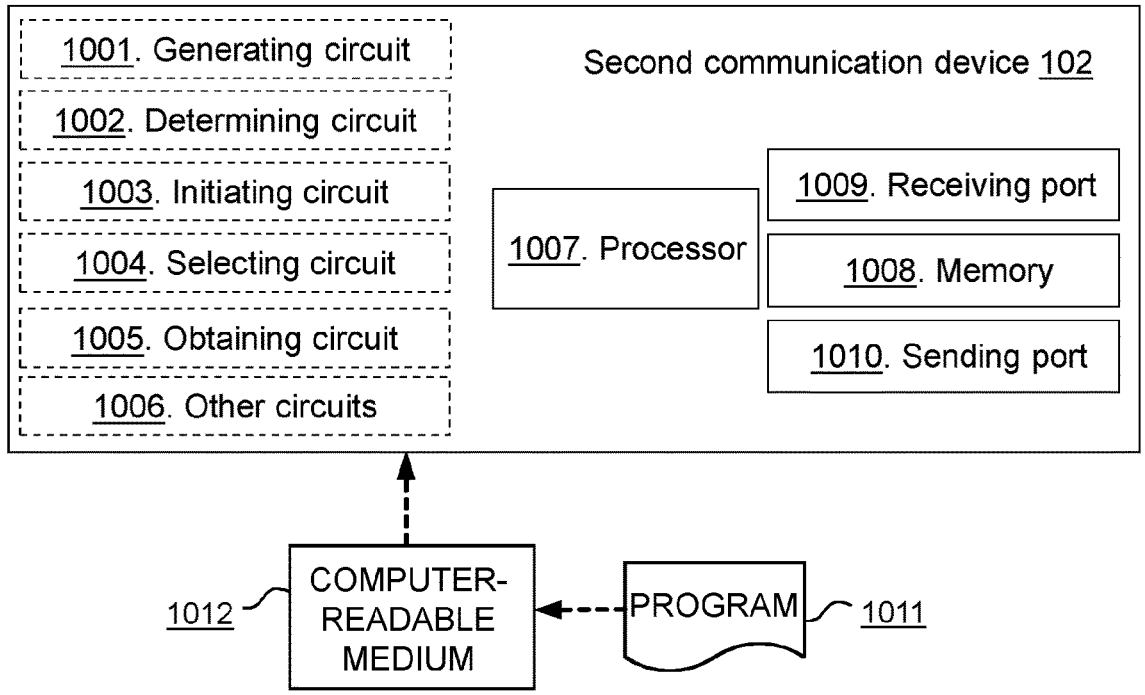
FIG. 10 is a schematic block diagram illustrating two non-limiting examples, a) and b), of a second communication device, according to embodiments herein.
Figure 10:
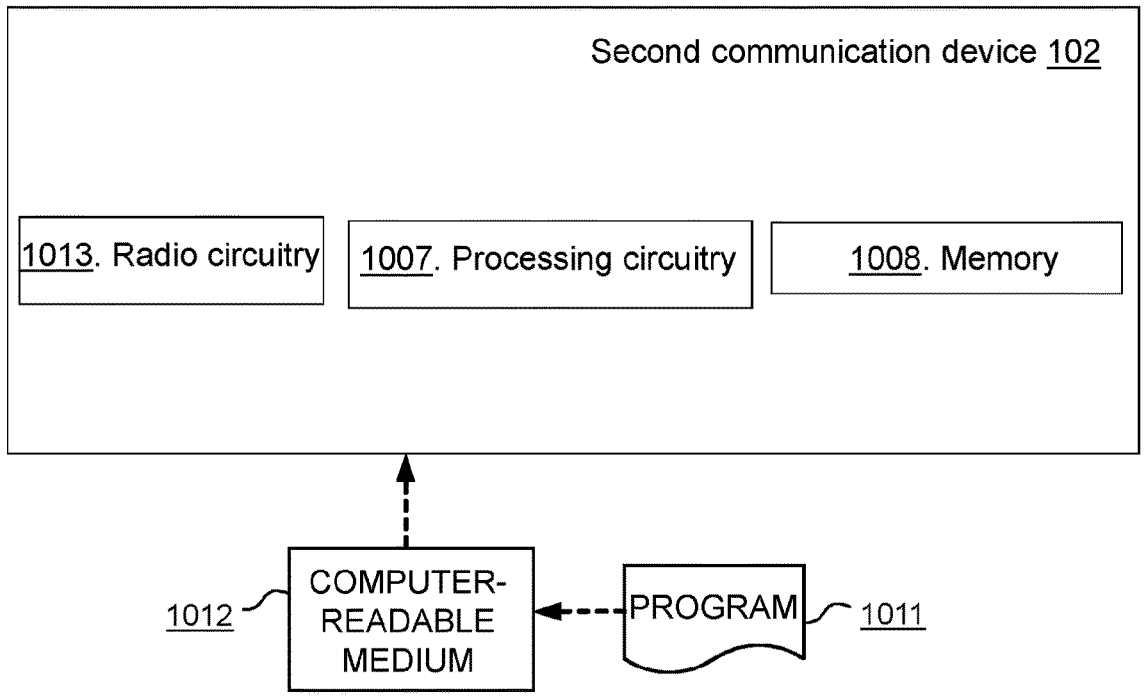

FIG. 10 depicts two different examples in panels a) and b), respectively, of the arrangement that the second communication device 102 may comprise to perform the method actions described above in relation to FIG. 7. In some embodiments, the second communication device 102 may comprise the following arrangement depicted in FIG. 10a. The second communication device 102 may be configured to handle decoding of a channel. The second communication device 102 is configured to operate in the communications network 100.

Several embodiments are comprised herein. Components from one embodiment may be tacitly assumed to be present in another embodiment and it will be obvious to a person skilled in the art how those components may be used in the other exemplary embodiments. The detailed description of some of the following corresponds to the same references provided above, in relation to the actions described for the second communication device 102, and will thus not be repeated here. For example, the physical broadcast channel may be configured to be the PBCH, and the communications network 100 may be configured to operate on NR.

In FIG. 10, optional circuits are indicated with dashed boxes.

The second communication device 102 may be configured to perform the generating of Action 701, e.g. by means of a generating circuit 1001 within the second communication device 102, configured to obtain the set of correspondences between the first set of physical cell identity information of the second communication device 102 and the second set of time indexes of synchronization signal and physical broadcast channel (SS/PBCH) blocks configured in the secondary communication device 102. The generating circuit 1001 may be the processor 1007 of the second communication device 102, or an application running on such processor.

The second communication device 102 may be configured to perform the determining of Action 702, e.g. by means of a determining circuit 1002 within the second communication device 102, configured to determine the time index of the synchronization signal and PBCH block (SS/PBCH block), for transmitting primary and secondary synchronization signals and the physical broadcast channel to the first communication device 101 configured to operate in the communications network 100. The determining circuit 1002 may be a processor 1007 of the second communication device 102, or an application running on such processor.

The second communication device 102 is configured to perform the initiating providing of Action 703, e.g. by means of an initiating circuit 1002 within the second communication device 102, configured to initiate providing the first indication of the time index of the SS/PBCH block configured to be determined to the first communication device 101; the first indication configured to be provided to the first communication device 101 is configured to be based on the set of correspondences configured to be generated. The initiating circuit 1002 may be the processor 1007 of the second communication device 102, or an application running on such processor.

The first indication may be further configured to indicate one of: a) the reference signal sequence configured to be used for the physical broadcast channel demodulation, and b) the set of correspondences between the first set of physical cell identify information of the second communication device 102 and the second set of time indexes of SS/PBCH blocks configured in the secondary communication device 102.

In some embodiments, to determine may be configured to be based on the number of configured SS/PBCH blocks and their transmission timings in the second communication device 102.

The second communication device 102 may be configured to perform the receiving of Action 604, e.g. by means of a selecting circuit 1004 within the second communication device 102, configured to select the first method, to be used by the first communication device 101 to decode the physical broadcast channel, from the plurality of methods to decode the physical broadcast channel. The plurality of methods to decode the physical broadcast channel is configured to comprise: a) single-shot decoding only, b) soft-combining decoding only, and c) both single-shot decoding and soft-combining decoding simultaneously. The selecting may be based on the time index of the SS/PBCH block configured to be determined. The selecting circuit 1004 may be the processor 1007 of the second communication device 102, or an application running on such processor.

The selecting may be configured to be based on at least one of: one or more properties of the radio channel the physical broadcast channel is configured to be transmitted on by the second communication device 102, and the mobility of the first communication device 101.

The second communication device 102 may be configured to perform the initiating providing of Action 705, e.g. by means of the initiating circuit 1003 within the second communication device 102, configured to initiate providing the second indication configured to indicate the first method configured to be selected, to the first communication device 101. The initiating circuit 1003 may be the processor 1007 of the second communication device 102, or an application running on such processor.

The second communication device 102 is configured to perform the obtaining of Action 706, e.g. by means of an obtaining circuit 1005 within the second communication device 102, configured to obtain the one or more numbers of consecutive transmissions of the physical broadcast channel for any of the b) soft-combining decoding only, and c) both single-shot decoding and soft-combining decoding simultaneously, methods. The obtaining circuit 1005 may be the processor 1007 of the second communication device 102, or an application running on such processor.

The second communication device 102 may be configured to perform the initiating providing of Action 707, e.g. by means of the initiating circuit 1002 within the second communication device 102, configured to initiate providing the third indication configured to indicate the one or more numbers configured to be obtained, to the first communication device 101.

The one or more properties of the radio channel may be configured to comprise the fourth indication of at least one of: a) the quality of the signal configured to be transmitted by the second communication device 102, b) the condition of the radio channel, and c) the speed of the first communication device 101.

Other circuits 1006 may be comprised in the second communication device 102.

The embodiments herein in the second communication device 102 may be implemented through one or more processors, such as a processor 1007 in the second communication device 102 depicted in FIG. 10a, together with computer program code for performing the functions and actions of the embodiments herein. A processor, as used herein, may be understood to be a hardware component. The program code mentioned above may also be provided as a computer program product, for instance in the form of a data carrier carrying computer program code for performing the embodiments herein when being loaded into the second communication device 102. One such carrier may be in the form of a CD ROM disc. It is however feasible with other data carriers such as a memory stick. The computer program code may furthermore be provided as pure program code on a server and downloaded to the second communication device 102.

The second communication device 102 may further comprise a memory 1008 comprising one or more memory units. The memory 1008 is arranged to be used to store obtained information, store data, configurations, schedulings, and applications etc. to perform the methods herein when being executed in the second communication device 102.

In some embodiments, the second communication device 102 may receive information from, e.g., the first communication device 101, through a receiving port 1009. In some embodiments, the receiving port 1009 may be, for example, connected to one or more antennas in second communication device 102. In other embodiments, the second communication device 102 may receive information from another structure in the communications network 100 through the receiving port 1009. Since the receiving port 1009 may be in communication with the processor 1007, the receiving port 1009 may then send the received information to the processor 1007. The receiving port 1009 may also be configured to receive other information.

The processor 1007 in the second communication device 102 may be further configured to transmit or send information to e.g., the first communication device 101, or another structure in the communications network 100, through a sending port 1010, which may be in communication with the processor 1007, and the memory 1008.

Those skilled in the art will also appreciate that the generating circuit 1001, the determining circuit 1002, the initiating circuit 1003, the selecting circuit 1004, the obtaining circuit 1005, and the other circuits 1006 described above may refer to a combination of analog and digital circuits, and/or one or more processors configured with software and/or firmware, e.g., stored in memory, that, when executed by the one or more processors such as the processor 1007, perform as described above. One or more of these processors, as well as the other digital hardware, may be included in a single Application-Specific Integrated Circuit (ASIC), or several processors and various digital hardware may be distributed among several separate components, whether individually packaged or assembled into a System-on-a-Chip (SoC).

Also, in some embodiments, the different circuits 1001-1006 described above may be implemented as one or more applications running on one or more processors such as the processor 1007.

Thus, the methods according to the embodiments described herein for the second communication device 102 may be respectively implemented by means of a computer program 1011 product, comprising instructions, i.e., software code portions, which, when executed on at least one processor 1007, cause the at least one processor 1007 to carry out the actions described herein, as performed by the second communication device 102. The computer program 1011 product may be stored on a computer-readable storage medium 1012. The computer-readable storage medium 1012, having stored thereon the computer program 1011, may comprise instructions which, when executed on at least one processor 1007, cause the at least one processor 1007 to carry out the actions described herein, as performed by the second communication device 102. In some embodiments, the computer-readable storage medium 1012 may be a non-transitory computer-readable storage medium, such as a CD ROM disc, or a memory stick. In other embodiments, the computer program 1011 product may be stored on a carrier containing the computer program 1011 just described, wherein the carrier is one of an electronic signal, optical signal, radio signal, or the computer-readable storage medium 1012, as described above.

The second communication device 102 may comprise a communication interface configured to facilitate communications between the second communication device 102 and other nodes or devices, e.g., the first communication device 101. The interface may, for example, include a transceiver configured to transmit and receive radio signals over an air interface in accordance with a suitable standard.

In other embodiments, the second communication device 102 may comprise the following arrangement depicted in FIG. 10b. The second communication device 102 may comprise a processing circuitry 1007, e.g., one or more processors such as the processor 1007, in the second communication device 102 and the memory 1008. The second communication device 102 may also comprise a radio circuitry 1013, which may comprise e.g., the receiving port 1009 and the sending port 1010. The processing circuitry 1013 may be configured to, or operable to, perform the method actions according to FIGS. 7, and/or 12-16, in a similar manner as that described in relation to FIG. 10a. The radio circuitry 1013 may be configured to set up and maintain at least a wireless connection with the first communication device 101. Circuitry may be understood herein as a hardware component.

Hence, embodiments herein also relate to the second communication device 102 operative to operate in the communications network 100. The second communication device 102 may comprise the processing circuitry 1007 and the memory 1008, said memory 1008 containing instructions executable by said processing circuitry 1007, whereby the second communication device 102 is further operative to perform the actions described herein in relation to the second communication device 102, e.g., in FIGS. 7, and/or 12-16.

As used herein, the expression "at least one of:" followed by a list of alternatives separated by commas, and wherein the last alternative is preceded by the "and" term, may be understood to mean that only one of the list of alternatives may apply, more than one of the list of alternatives may apply or all of the list of alternatives may apply. This expression may be understood to be equivalent to the expression "at least one of:" followed by a list of alternatives separated by commas, and wherein the last alternative is preceded by the "or" term.

Further Extensions and Variations

Figure 11:
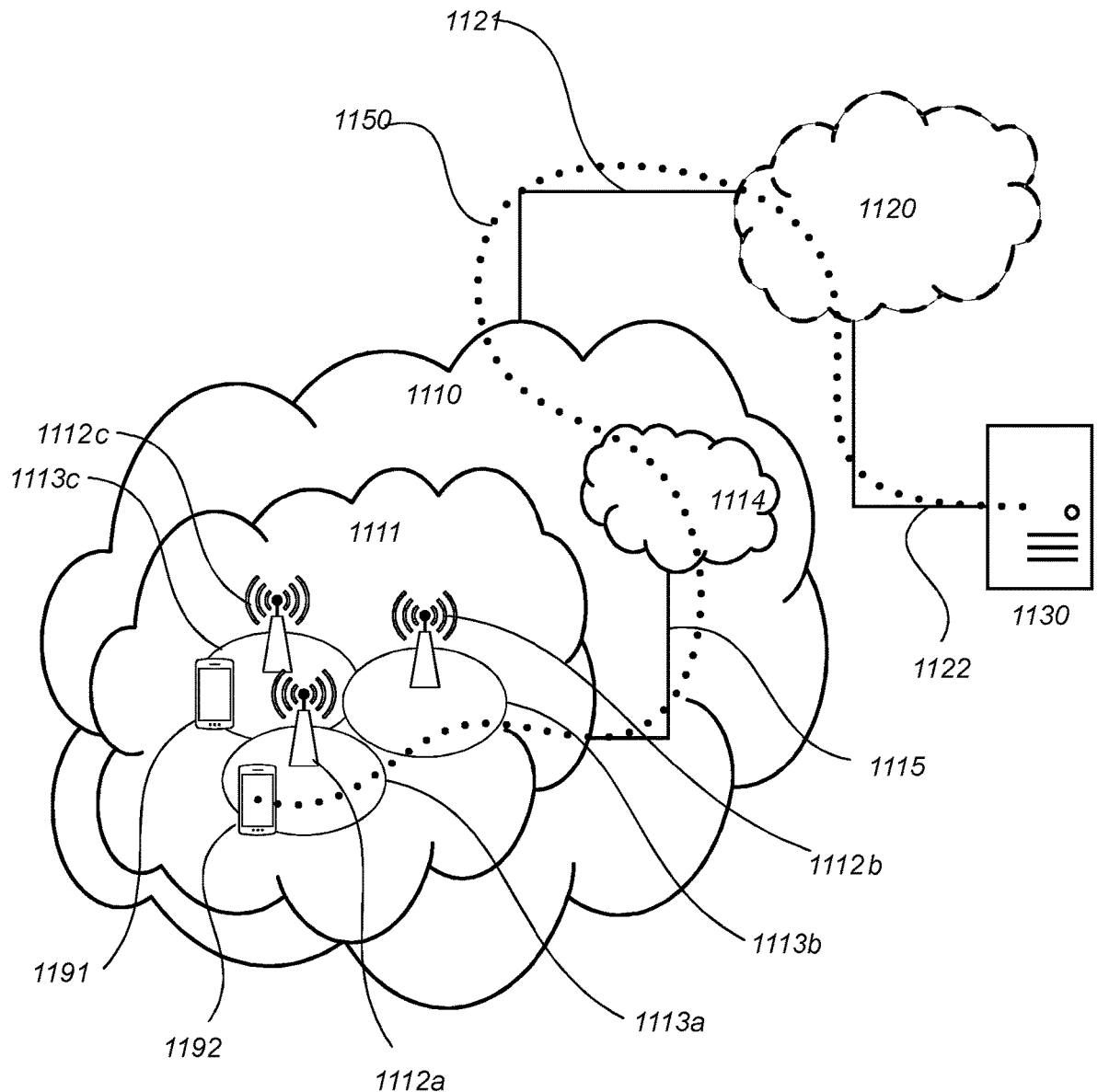
FIG. 11 is a schematic block diagram illustrating a telecommunication network connected via an intermediate network to a host computer, according to embodiments herein.

FIG. 11: Telecommunication Network Connected Via an Intermediate Network to a Host Computer in Accordance with Some Embodiments With reference to FIG. 11, in accordance with an embodiment, a communication system includes telecommunication network 1110 such as the communications network 100, for example, a 3GPP-type cellular network, which comprises access network 1111, such as a radio access network, and core network 1114. Access network 1111 comprises a plurality of network nodes such as the network node 110. For example, base stations 1112a, 1112b, 1112c, such as NBs, eNBs, gNBs or other types of wireless access points, each defining a corresponding coverage area 1113a, 1113b, 1113c. Each base station 1112a, 1112b, 1112c is connectable to core network 1114 over a wired or wireless connection 1115. A plurality of wireless devices, such as the wireless device 130 are comprised in the communications network 100. In FIG. 11, a first UE 1191 located in coverage area 1113c is configured to wirelessly connect to, or be paged by, the corresponding base station 1112c. A second UE 1192 in coverage area 1113a is wirelessly connectable to the corresponding base station 1112a. While a plurality of UEs 1191, 1192 are illustrated in this example, the disclosed embodiments are equally applicable to a situation where a sole UE is in the coverage area or where a sole UE is connecting to the corresponding base station 1112. Any of the UEs 1191, 1192 are examples of the wireless device 130.

Telecommunication network 1110 is itself connected to host computer 1130, which may be embodied in the hardware and/or software of a standalone server, a cloud-implemented server, a distributed server or as processing resources in a server farm. Host computer 1130 may be under the ownership or control of a service provider, or may be operated by the service provider or on behalf of the service provider. Connections 1121 and 1122 between telecommunication network 1110 and host computer 1130 may extend directly from core network 1114 to host computer 1130 or may go via an optional intermediate network 1120. Intermediate network 1120 may be one of, or a combination of more than one of, a public, private or hosted network; intermediate network 1120, if any, may be a backbone network or the Internet; in particular, intermediate network 1120 may comprise two or more sub-networks (not shown).

The communication system of FIG. 11 as a whole enables connectivity between the connected UEs 1191, 1192 and host computer 1130. The connectivity may be described as an over-the-top (OTT) connection 1150. Host computer 1130 and the connected UEs 1191, 1192 are configured to communicate data and/or signaling via OTT connection 1150, using access network 1111, core network 1114, any intermediate network 1120 and possible further infrastructure (not shown) as intermediaries. OTT connection 1150 may be transparent in the sense that the participating communication devices through which OTT connection 1150 passes are unaware of routing of uplink and downlink communications. For example, base station 1112 may not or need not be informed about the past routing of an incoming downlink communication with data originating from host computer 1130 to be forwarded (e.g., handed over) to a connected UE 1191. Similarly, base station 1112 need not be aware of the future routing of an outgoing uplink communication originating from the UE 1191 towards the host computer 1130.

In relation to FIGS. 12, 13, 14, 15, and 16, which are described next, it may be understood that a UE is an example of the first communication device 101, and that any description provided for the UE equally applies to the first communication device 101. It may be also understood that the base station is an example of the second communication device 102, and that any description provided for the base station equally applies to the second communication device 102.

Figure 12:
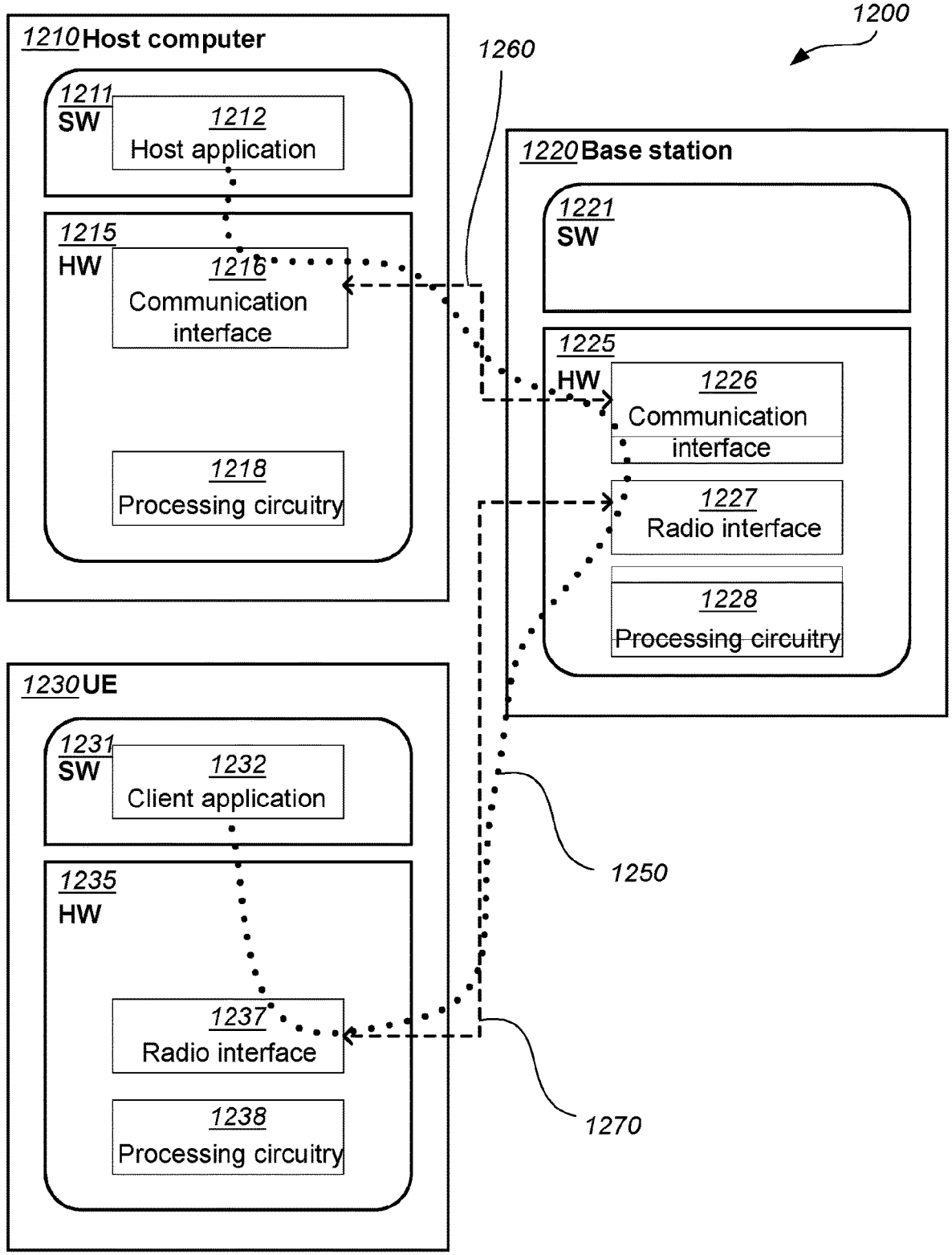
FIG. 12 is a generalized block diagram of a host computer communicating via a base station with a user equipment over a partially wireless connection, according to embodiments herein.

FIG. 12: Host Computer Communicating Via a Base Station with a User Equipment Over a Partially Wireless Connection in Accordance with Some Embodiments Example implementations, in accordance with an embodiment, of the first communication device 101, e.g., a UE, the second communication device 102, e.g., a base station and host computer discussed in the preceding paragraphs will now be described with reference to FIG. 12. In communication system 1200, such as the communications network 100, host computer 1210 comprises hardware 1215 including communication interface 1216 configured to set up and maintain a wired or wireless connection with an interface of a different communication device of communication system 1200. Host computer 1210 further comprises processing circuitry 1218, which may have storage and/or processing capabilities. In particular, processing circuitry 1218 may comprise one or more programmable processors, application-specific integrated circuits, field programmable gate arrays or combinations of these (not shown) adapted to execute instructions. Host computer 1210 further comprises software 1211, which is stored in or accessible by host computer 1210 and executable by processing circuitry 1218. Software 1211 includes host application 1212. Host application 1212 may be operable to provide a service to a remote user, such as UE 1230 connecting via OTT connection 1250 terminating at UE 1230 and host computer 1210. In providing the service to the remote user, host application 1212 may provide user data which is transmitted using OTT connection 1250.

Communication system 1200 further includes the second communication device 102, exemplified in FIG. 12 as a base station 1220 provided in a telecommunication system and comprising hardware 1225 enabling it to communicate with host computer 1210 and with UE 1230. Hardware 1225 may include communication interface 1226 for setting up and maintaining a wired or wireless connection with an interface of a different communication device of communication system 1200, as well as radio interface 1227 for setting up and maintaining at least wireless connection 1270 with the first communication device 101, exemplified in FIG. 12 as a UE 1230 located in a coverage area (not shown in FIG. 12) served by base station 1220. Communication interface 1226 may be configured to facilitate connection 1260 to host computer 1210. Connection 1260 may be direct or it may pass through a core network (not shown in FIG. 12) of the telecommunication system and/or through one or more intermediate networks outside the telecommunication system. In the embodiment shown, hardware 1225 of base station 1220 further includes processing circuitry 1228, which may comprise one or more programmable processors, application-specific integrated circuits, field programmable gate arrays or combinations of these (not shown) adapted to execute instructions. Base station 1220 further has software 1221 stored internally or accessible via an external connection.

Communication system 1200 further includes UE 1230 already referred to. Its hardware 1235 may include radio interface 1237 configured to set up and maintain wireless connection 1270 with a base station serving a coverage area in which UE 1230 is currently located. Hardware 1235 of UE 1230 further includes processing circuitry 1238, which may comprise one or more programmable processors, application-specific integrated circuits, field programmable gate arrays or combinations of these (not shown) adapted to execute instructions. UE 1230 further comprises software 1231, which is stored in or accessible by UE 1230 and executable by processing circuitry 1238. Software 1231 includes client application 1232. Client application 1232 may be operable to provide a service to a human or non-human user via UE 1230, with the support of host computer 1210. In host computer 1210, an executing host application 1212 may communicate with the executing client application 1232 via OTT connection 1250 terminating at UE 1230 and host computer 1210. In providing the service to the user, client application 1232 may receive request data from host application 1212 and provide user data in response to the request data. OTT connection 1250 may transfer both the request data and the user data. Client application 1232 may interact with the user to generate the user data that it provides.

It is noted that host computer 1210, base station 1220 and UE 1230 illustrated in FIG. 12 may be similar or identical to host computer 1130, one of base stations 1112*a*, 1112*b*, 1112*c* and one of UEs 1191, 1192 of FIG. 11, respectively. This is to say, the inner workings of these entities may be as shown in FIG. 12 and independently, the surrounding network topology may be that of FIG. 11.

In FIG. 12, OTT connection 1250 has been drawn abstractly to illustrate the communication between host computer 1210 and UE 1230 via base station 1220, without explicit reference to any intermediary devices and the precise routing of messages via these devices. Network infrastructure may determine the routing, which it may be configured to hide from UE 1230 or from the service provider operating host computer 1210, or both. While OTT connection 1250 is active, the network infrastructure may further take decisions by which it dynamically changes the routing (e.g., on the basis of load balancing consideration or reconfiguration of the network).

Wireless connection 1270 between UE 1230 and base station 1220 is in accordance with the teachings of the embodiments described throughout this disclosure. One or more of the various embodiments improve the performance of OTT services provided to UE 1230 using OTT connection 1250, in which wireless connection 1270 forms the last segment. More precisely, the teachings of these embodiments may improve the latency, signalling overhead, and service interruption and thereby provide benefits such as reduced user waiting time, better responsiveness and extended battery lifetime.

A measurement procedure may be provided for the purpose of monitoring data rate, latency and other factors on which the one or more embodiments improve. There may further be an optional network functionality for reconfiguring OTT connection 1250 between host computer 1210 and UE 1230, in response to variations in the measurement results. The measurement procedure and/or the network functionality for reconfiguring OTT connection 1250 may be implemented in software 1211 and hardware 1215 of host computer 1210 or in software 1231 and hardware 1235 of UE 1230, or both. In embodiments, sensors (not shown) may be deployed in or in association with communication devices through which OTT connection 1250 passes; the sensors may participate in the measurement procedure by supplying values of the monitored quantities exemplified above, or supplying values of other physical quantities from which software 1211, 1231 may compute or estimate the monitored quantities. The reconfiguring of OTT connection 1250 may include message format, retransmission settings, preferred routing etc.; the reconfiguring need not affect base station 1220, and it may be unknown or imperceptible to base station 1220. Such procedures and functionalities may be known and practiced in the art. In certain embodiments, measurements may involve proprietary UE signaling facilitating host computer 1210's measurements of throughput, propagation times, latency and the like. The measurements may be implemented in that software 1211 and 1231 causes messages to be transmitted, in particular empty or 'dummy' messages, using OTT connection 1250 while it monitors propagation times, errors etc.

The first communication device 101 may comprise an arrangement as shown in FIG. 9 or in FIG. 12.

The first communication device 101 may comprise an interface unit to facilitate communications between the first communication device 101 and other nodes or devices, e.g., the second communication device 102, the host computer 1210, or any of the other nodes. In some particular examples, the interface may, for example, include a transceiver configured to transmit and receive radio signals over an air interface in accordance with a suitable standard.

The first communication device 101 may also comprise a client application 1232 or a client application circuit, which may be configured to communicate user data with a host application circuit in a host computer 1210, e.g., via another link such as 1250.

The second communication device 102 may comprise an arrangement as shown in FIG. 10 or in FIG. 12.

The second communication device 102 may comprise an interface unit to facilitate communications between the second communication device 102 and other nodes or devices, e.g., the first communication device 101, the host computer 1210, or any of the other nodes. In some particular examples, the interface may, for example, include a transceiver configured to transmit and receive radio signals over an air interface in accordance with a suitable standard.

The second communication device 102 may also comprise a communication interface 1226 and/or a radio interface 1227, which may be configured to communicate user data with a host application circuit in a host computer 1210, e.g., via another link such as 1250.

FIG. 13: Methods Implemented in a Communication System Including a Host Computer, a Base Station and a User Equipment in Accordance with Some Embodiments FIG. 13 is a flowchart illustrating a method implemented in a communication system, in accordance with one embodiment. The communication system includes a host computer, a base station and a UE which may be those described with reference to FIGS. 11 and 12. For simplicity of the present disclosure, only drawing references to FIG. 13 will be included in this section. In step 1310, the host computer provides user data. In substep 1311 (which may be optional) of step 1310, the host computer provides the user data by executing a host application. In step 1320, the host computer initiates a transmission carrying the user data to the UE. In step 1330 (which may be optional), the base station transmits to the UE the user data which was carried in the transmission that the host computer initiated, in accordance with the teachings of the embodiments described throughout this disclosure. In step 1340 (which may also be optional), the UE executes a client application associated with the host application executed by the host computer.

FIG. 14: Methods Implemented in a Communication System Including a Host Computer, a Base Station and a User Equipment in Accordance with Some Embodiments FIG. 14 is a flowchart illustrating a method implemented in a communication system, in accordance with one embodiment. The communication system includes a host computer, a base station and a UE which may be those described with reference to FIGS. 11 and 12. For simplicity of the present disclosure, only drawing references to FIG. 14 will be included in this section. In step 1410 of the method, the host computer provides user data. In an optional substep (not shown) the host computer provides the user data by executing a host application. In step 1420, the host computer initiates a transmission carrying the user data to the UE. The transmission may pass via the base station, in accordance with the teachings of the embodiments described throughout this disclosure. In step 1430 (which may be optional), the UE receives the user data carried in the transmission.

FIG. 15: Methods Implemented in a Communication System Including a Host Computer, a Base Station and a User Equipment in Accordance with Some Embodiments FIG. 15 is a flowchart illustrating a method implemented in a communication system, in accordance with one embodiment. The communication system includes a host computer, a base station and a UE which may be those described with reference to FIGS. 11 and 12. For simplicity of the present disclosure, only drawing references to FIG. 15 will be included in this section. In step 1510 (which may be optional), the UE receives input data provided by the host computer. Additionally or alternatively, in step 1520, the UE provides user data. In substep 1521 (which may be optional) of step 1520, the UE provides the user data by executing a client application. In substep 1511 (which may be optional) of step 1510, the UE executes a client application which provides the user data in reaction to the received input data provided by the host computer. In providing the user data, the executed client application may further consider user input received from the user. Regardless of the specific manner in which the user data was provided, the UE initiates, in substep 1530 (which may be optional), transmission of the user data to the host computer. In step 1540 of the method, the host computer receives the user data transmitted from the UE, in accordance with the teachings of the embodiments described throughout this disclosure.

FIG. 16: Methods Implemented in a Communication System Including a Host Computer, a Base Station and a User Equipment in Accordance with Some Embodiments FIG. 16 is a flowchart illustrating a method implemented in a communication system, in accordance with one embodiment. The communication system includes a host computer, a base station and a UE which may be those described with reference to FIGS. 11 and 12. For simplicity of the present disclosure, only drawing references to FIG. 16 will be included in this section. In step 1610 (which may be optional), in accordance with the teachings of the embodiments described throughout this disclosure, the base station receives user data from the UE. In step 1620 (which may be optional), the base station initiates transmission of the received user data to the host computer. In step 1630 (which may be optional), the host computer receives the user data carried in the transmission initiated by the base station.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein.

The first communication device 101 embodiments relate to FIG. 6, FIG. 8, FIGS. 9, and 12-16.

The second communication device 102 embodiments relate to FIG. 7, FIGS. 10, and 12-16.

Further Numbered Embodiments

1. A base station configured to communicate with a user equipment (UE), the base station comprising a radio interface and processing circuitry configured to perform one or more of the actions described herein as performed by the second communication device 102.

5. A communication system including a host computer comprising:
 processing circuitry configured to provide user data; and
 a communication interface configured to forward the user data to a cellular network for transmission to a user equipment (UE),
 wherein the cellular network comprises a base station having a radio interface and processing circuitry, the base station's processing circuitry configured to perform one or more of the actions described herein as performed by the second communication device 102.

6. The communication system of embodiment 5, further including the base station.

7. The communication system of embodiment 6, further including the UE, wherein the UE is configured to communicate with the base station.

8. The communication system of embodiment 7, wherein:
the processing circuitry of the host computer is configured to execute a host application, thereby providing the user data; and
the UE comprises processing circuitry configured to execute a client application associated with the host application.

11. A method implemented in a base station, comprising one or more of the actions described herein as performed by the second communication device 102.

15. A method implemented in a communication system including a host computer, a base station and a user equipment (UE), the method comprising:
at the host computer, providing user data; and
at the host computer, initiating a transmission carrying the user data to the UE via a cellular network comprising the base station, wherein the base station performs one or more of the actions described herein as performed by the second communication device 102.

16. The method of embodiment 15, further comprising:
at the base station, transmitting the user data.

17. The method of embodiment 16, wherein the user data is provided at the host computer by executing a host application, the method further comprising:
at the UE, executing a client application associated with the host application.

21. A user equipment (UE) configured to communicate with a base station, the UE comprising a radio interface and processing circuitry configured to perform one or more of the actions described herein as performed by the first communication device 101.

25. A communication system including a host computer comprising:
processing circuitry configured to provide user data; and
a communication interface configured to forward user data to a cellular network for transmission to a user equipment (UE),
wherein the UE comprises a radio interface and processing circuitry, the UE's processing circuitry configured to perform one or more of the actions described herein as performed by the first communication device 101.

26. The communication system of embodiment 25, further including the UE.

27. The communication system of embodiment 26, wherein the cellular network further includes a base station configured to communicate with the UE.

28. The communication system of embodiment 26 or 27, wherein:
the processing circuitry of the host computer is configured to execute a host application, thereby providing the user data; and
the UE's processing circuitry is configured to execute a client application associated with the host application.

31. A method implemented in a user equipment (UE), comprising one or more of the actions described herein as performed by the first communication device 101.

35. A method implemented in a communication system including a host computer, a base station and a user equipment (UE), the method comprising:
at the host computer, providing user data; and
at the host computer, initiating a transmission carrying the user data to the UE via a cellular network comprising the base station, wherein the UE performs one or more of the actions described herein as performed by the first communication device 101.

36. The method of embodiment 35, further comprising:
at the UE, receiving the user data from the base station.

41. A user equipment (UE) configured to communicate with a base station, the UE comprising a radio interface and processing circuitry configured to perform one or more of the actions described herein as performed by the first communication device 101.

45. A communication system including a host computer comprising:
a communication interface configured to receive user data originating from a transmission from a user equipment (UE) to a base station,
wherein the UE comprises a radio interface and processing circuitry, the UE's processing circuitry configured to: perform one or more of the actions described herein as performed by the first communication device 101.

46. The communication system of embodiment 45, further including the UE.

47. The communication system of embodiment 46, further including the base station, wherein the base station comprises a radio interface configured to communicate with the UE and a communication interface configured to forward to the host computer the user data carried by a transmission from the UE to the base station.

48. The communication system of embodiment 46 or 47, wherein:
the processing circuitry of the host computer is configured to execute a host application; and
the UE's processing circuitry is configured to execute a client application associated with the host application, thereby providing the user data.

49. The communication system of embodiment 46 or 47, wherein:
the processing circuitry of the host computer is configured to execute a host application, thereby providing request data; and
the UE's processing circuitry is configured to execute a client application associated with the host application, thereby providing the user data in response to the request data.

51. A method implemented in a user equipment (UE), comprising one or more of the actions described herein as performed by the first communication device 101.

52. The method of embodiment 51, further comprising:
providing user data; and
forwarding the user data to a host computer via the transmission to the base station.

55. A method implemented in a communication system including a host computer, a base station and a user equipment (UE), the method comprising:
at the host computer, receiving user data transmitted to the base station from the UE, wherein the UE performs one or more of the actions described herein as performed by the first communication device 101.

56. The method of embodiment 55, further comprising:
at the UE, providing the user data to the base station.

57. The method of embodiment 56, further comprising:
at the UE, executing a client application, thereby providing the user data to be transmitted; and
at the host computer, executing a host application associated with the client application.

58. The method of embodiment 56, further comprising:
at the UE, executing a client application; and
at the UE, receiving input data to the client application, the input data being provided at the host computer by executing a host application associated with the client application,
wherein the user data to be transmitted is provided by the client application in response to the input data.

61. A base station configured to communicate with a user equipment (UE), the base station comprising a radio interface and processing circuitry configured to perform one or more of the actions described herein as performed by the second communication device 102.

65. A communication system including a host computer comprising a communication interface configured to receive user data originating from a transmission from a user equipment (UE) to a base station, wherein the base station comprises a radio interface and processing circuitry, the base station's processing circuitry configured to perform one or more of the actions described herein as performed by the second communication device 102.

66. The communication system of embodiment 65, further including the base station.

67. The communication system of embodiment 66, further including the UE, wherein the UE is configured to communicate with the base station.

68. The communication system of embodiment 67, wherein:
the processing circuitry of the host computer is configured to execute a host application;
the UE is configured to execute a client application associated with the host application, thereby providing the user data to be received by the host computer.

71. A method implemented in a base station, comprising one or more of the actions described herein as performed by the second communication device 102.

75. A method implemented in a communication system including a host computer, a base station and a user equipment (UE), the method comprising:
at the host computer, receiving, from the base station, user data originating from a transmission which the base station has received from the UE, wherein the UE performs one or more of the actions described herein as performed by the first communication device 101.

76. The method of embodiment 75, further comprising:
at the base station, receiving the user data from the UE.

77. The method of embodiment 76, further comprising:
at the base station, initiating a transmission of the received user data to the host computer.

Abbreviations

At least some of the following abbreviations may be used in this disclosure. If there is an inconsistency between abbreviations, preference should be given to how it is used above. If listed multiple times below, the first listing should be preferred over any subsequent listing(s).
3GPP 3rd Generation Partnership Project
5G 5th Generation
DL Downlink
eNB E-UTRAN NodeB
E-UTRA Evolved UTRA
E-UTRAN Evolved UTRAN
GERAN GSM EDGE Radio Access Network
gNB Base station in NR
GSM Global System for Mobile communication
HSPA High Speed Packet Access
LTE Long-Term Evolution
OFDM Orthogonal Frequency Division Multiplexing
UE User Equipment
UL Uplink
UMTS Universal Mobile Telecommunication System
UTRA Universal Terrestrial Radio Access
UTRAN Universal Terrestrial Radio Access Network
WCDMA Wide CDMA
WLAN Wide Local Area Network
SSS Secondary synchronization signals
PSS Primary synchronization signals
MIB Master information block
PBCH Physical broadcast channel
UE User equipment
NR New radio access technology or New radio
DMRS Demodulation reference signal
MSB Most significant bit
LSB Least significant bit
SFN System frame number
TTI transmit time interval
CRC Cyclic redundancy check
RE Resource elements
QPSK Quadrature phase shift keying
SNR Signal to noise radio
RSRP Reference signal received power
RSRQ Reference signal received quality
CSI-RS Channel state indicator reference signal
SINR Signal to interference and noise ratio
PCI Physical cell ID

The invention claimed is:

1. A method performed by a second communication device, the second communication device operating in a communications network, the method comprising:
obtaining a set of correspondences between a first set of physical cell identity information of the second communication device and a second set of time indexes of synchronization signal and physical broadcast channel, SS/PBCH, blocks configured in the secondary communication device, the set of correspondences obtained by determining an association between the first set of physical cell identity information and the second set of time indexes of SS/PBCH blocks based on one or more parameters;
determining a time index, from the second set of time indexes, of a SS/PBCH block for transmitting primary and secondary synchronization signals and a physical broadcast channel to a first communication device operating in the communications network, the primary and secondary synchronization signals and the physical broadcast channel being comprised in the SS/PBCH block, the determining based on a number of configured SS/PBCH blocks and their transmission timings in the second communication device; and
providing a first indication of the determined time index of the SS/PBCH block and the set of correspondences between the first set of physical cell identity information of the second communication device and the second set of time indexes of SS/PBCH blocks configured in the secondary communication device to the first communication device, the first indication provided to the first communication device being based on the obtained set of correspondences.

2. The method according claim 1, further comprising:
selecting a first method, to be used by the first communication device to
decode the physical broadcast channel, from a plurality of methods to decode the physical broadcast channel, wherein the plurality of methods to decode the physical broadcast channel comprises one of single-shot decoding only, soft-combining decoding only, and both single-shot decoding and soft-combining decoding simultaneously, the selecting being based on the determined time index of the SS/PBCH block; and
initiating providing a second indication indicating the selected first method to the first communication device.

3. The method according to claim 2, wherein the selecting is based on at least one of: one or more properties of a radio channel the physical broadcast channel is transmitted on by the second communication device, and a mobility of the first communication device.

4. The method according to claim 2, further comprising:
obtaining one or more numbers of consecutive transmissions of the physical broadcast channel for any of the soft-combining decoding only, and both single-shot decoding and soft-combining decoding simultaneously, methods; and
initiating providing a third indication indicating the obtained one or more numbers to the first communication device.

5. The method according to claim 3, wherein the one or more properties of the radio channel comprise a fourth indication of at least one of:
a quality of a signal transmitted by the second communication device;
a condition of the radio channel; and
a speed of the first communication device.

6. A second communication device configured to operate in a communications network, the second communication device being configured to:
obtain a set of correspondences between a first set of physical cell identity information of the second communication device and a second set of time indexes of synchronization signal and physical broadcast channel, SS/PBCH, blocks configured in the secondary communication device, the set of correspondences obtained by determining an association between the first set of physical cell identity information and the second set of time indexes of SS/PBCH blocks based on one or more parameters;
determine a time index, from the second set of time indexes, of a SS/PBCH block for transmitting primary and secondary synchronization signals and a physical broadcast channel to a first communication device configured to operate in the communications network, the primary and secondary synchronization signals and the physical broadcast channel being comprised in the SS/PBCH block, the determining based on a number of configured SS/PBCH blocks and their transmission timings in the second communication device; and
providing a first indication of the time index of the SS/PBCH block configured to be determined and the set of correspondences between the first set of physical cell identity information of the second communication device and the second set of time indexes of SS/PBCH blocks configured in the secondary communication device to the first communication device, the first indication provided to the first communication device being based on the obtained set of correspondences.

* * * * *